US011904611B2

(12) United States Patent
Ikemoto et al.

(10) Patent No.: US 11,904,611 B2
(45) Date of Patent: Feb. 20, 2024

(54) PRINTING DEVICE INCORPORATING ELECTRONIC CIRCUIT-BOARD UNIT INCLUDING HOLDER INTERPOSED BETWEEN FIRST AND SECOND SUBSTRATES FOR HOLDING ELECTRONIC COMPONENT AND HARNESS

(71) Applicant: BROTHER KOGYO KABUSHIKI KAISHA, Nagoya (JP)

(72) Inventors: Yusuke Ikemoto, Nagoya (JP); Yushi Kato, Nagoya (JP); Sho Asai, Nisshin (JP); Shotaro Watanabe, Nagoya (JP); Takehiko Inaba, Chita (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 117 days.

(21) Appl. No.: 17/713,677

(22) Filed: Apr. 5, 2022

(65) Prior Publication Data

US 2022/0324228 A1    Oct. 13, 2022

(30) Foreign Application Priority Data

Apr. 8, 2021 (JP) ................................ 2021-066153

(51) Int. Cl.
*B41J 2/14* (2006.01)
*H05K 1/14* (2006.01)

(52) U.S. Cl.
CPC ........... *B41J 2/1433* (2013.01); *H05K 1/144* (2013.01); *B41J 2002/14491* (2013.01); *H05K 2201/10189* (2013.01); *H05K 2201/2018* (2013.01)

(58) Field of Classification Search
CPC .. B41J 2/1433; B41J 2002/14491; B41J 2/32; H05K 1/144; H05K 2201/10189; H05K 2201/2018; H05K 2201/042; H05K 2201/2036
See application file for complete search history.

(56) References Cited

U.S. PATENT DOCUMENTS

2013/0259521 A1\* 10/2013 Sugiyama .......... G03G 21/1647
399/110

FOREIGN PATENT DOCUMENTS

| JP | H03-85691 U | 8/1991 |
| JP | 2014-192194 A | 10/2014 |
| JP | 2016-139697 A | 8/2016 |

\* cited by examiner

*Primary Examiner* — Bradley W Thies
(74) *Attorney, Agent, or Firm* — KENEALY VAIDYA LLP

(57) ABSTRACT

A printing device includes a frame, and an electronic circuit-board unit attached to the frame. The electronic circuit-board unit includes: a holder including a holding portion; a first substrate held to a first surface of the holder; a second substrate held to a second surface of the holder and attached to the frame; an electronic component; and a harness electrically connected to the electronic component. The holder has: a first region overlapped with the first substrate in a plan view; and a second region offset from the first region in the plan view. At least one of the electronic component and the harness is held by the holding portion.

12 Claims, 21 Drawing Sheets

PRINTING DEVICE INCORPORATING ELECTRONIC CIRCUIT-BOARD UNIT INCLUDING HOLDER INTERPOSED BETWEEN FIRST AND SECOND SUBSTRATES FOR HOLDING ELECTRONIC COMPONENT AND HARNESS

CROSS REFERENCE TO RELATED APPLICATIONS

This application claims priority from Japanese Patent Application No. 2021-066153 filed Apr. 8, 2021. The entire content of the priority application is incorporated herein by reference.

BACKGROUND

An electronic equipment such as a printing device generally employs an electronic circuit board for control of the equipment. Such an electronic circuit board of this kind is likely to include a plurality of substrates (boards). Conventionally, for assembly of the plurality of substrates, a holder is provided for attaching a sub board to a main board. The holder includes a frame for holding the sub board, a positioning portion, and a fixing portion. The positioning portion is fitted with a counterpart positioning portion of the main board in a state where the sub board is fixed to the frame, thereby fixing the fixing portion to a counterpart fixing portion of the main board. Hence, the main board and the sub board can be assembled to each other with a precise positional relation.

SUMMARY

The conventional electronic circuit board of this type is usually accompanied by electronic components and a harness. In the conventional structure mentioned above, a part for holding the electronic components and the harness is additionally required, which results in an increase in the number of parts or components and complexity in the assembling procedure of the printing device.

In view of the foregoing, it is an object of the present disclosure to provide a printing device including an electronic circuit board which requires a smaller number of parts and components to simplify the assembling procedure of the device.

In order to attain the above and other object, according to one aspect, the present disclosure provides a printing device including a frame, and an electronic circuit-board unit attached to the frame. The electronic circuit-board unit includes a holder, a first substrate, a second substrate, an electronic component, and a harness electrically connected to the electronic component. The holder has a first surface facing the frame, and a second surface opposite to the first surface. The holder has a first region and a second region, and includes a holding portion. The first substrate faces the first surface and is held to the first surface. The first substrate is overlapped with the first region in a plan view, and the first substrate is offset from the second region in the plan view. The second substrate faces the second surface and is held to the second surface. The second substrate is attached to the frame. At least one of the electronic component and the harness is held by the holding portion.

The printing device according to the disclosure includes the frame and the electronic circuit-board unit provided at the frame. The electronic circuit-board unit includes the first substrate, the second substrate, and the holder, all of which are assembled together as one unit. The first substrate faces the first surface of the holder and is fixed to the same, and the second substrate faces the second surface of the holder and is fixed to the same. The electronic circuit-board unit is fixedly positioned inside the printing device by the attachment of the second substrate to the frame. Since the unitized electronic circuit-board unit (configured of two substrates unitized via the holder) is fixed to the fame inside the printing device, the electronic circuit-board unit can be used for a general purpose, irrespective of the shapes of the cover and the casing of the printing device.

Further, the holder constituting the electronic circuit-board unit is divided into the first region and the second region. The holding portion of the holder is provided in the second region. At least one of the predetermined electronic component and the harness is held by the holding portion. With this structure, there is no need to provide any additional part or component for holding the predetermined electronic component associated with the electronic substrate and the harness extending outward from the electronic component. As a result, the number of parts can be reduced, and the assembling procedure can be facilitated, thereby realizing a reduction in production costs.

BRIEF DESCRIPTION OF THE DRAWINGS

The particular features and advantages of the embodiment(s) as well as other objects will become apparent from the following description taken in connection with the accompanying drawings, in which.

DETAILED DESCRIPTION

A printing device 1 according to one embodiment of the present disclosure will be described with reference to the accompanying drawings.

In the following description, terms such as "front", "rear", "above", "below" and "left" and "right" with respect to the printing device 1 will be used based on an assumption that the printing device 1 is disposed in an orientation in which it is intended to be used. Specifically, for a user of the printing device 1, a near side and a far side of the printing device 1 will be defined as "front side" and "rear side" of the printing device 1. The terms "upper", "lower", "leftward" and "rightward" in connection with the printing device 1 will be defined and illustrated in the attached drawings assuming that the user sees the printing device 1 from its front side.

<Overall Structure of the Printing Device 1>

Figure 1:
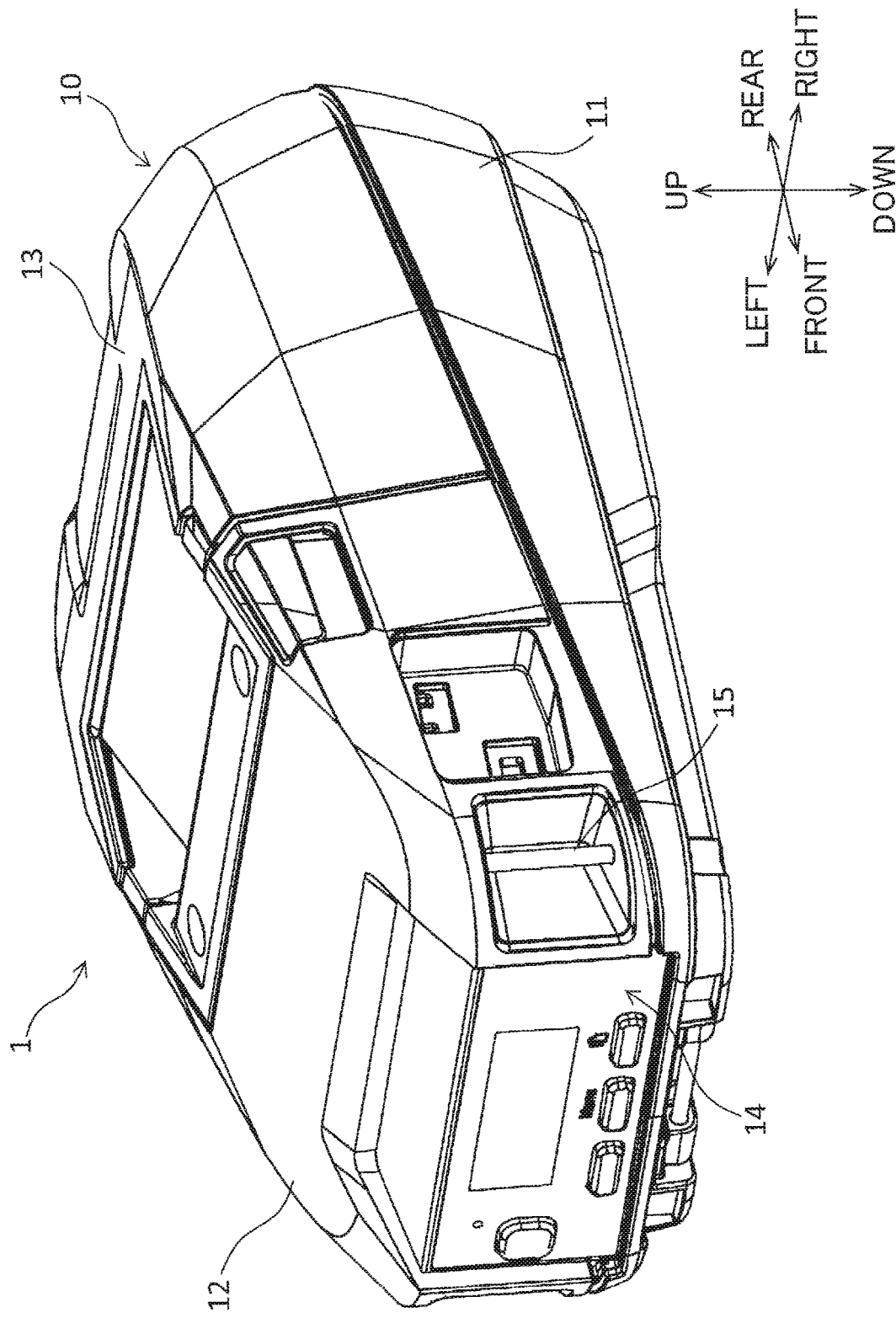
FIG. 1 is a perspective view of a printing device according to one embodiment.

In FIG. 1, the printing device 1 includes a casing 10 having a generally box shape. The casing 10 includes a lower case 11, an upper front cover 12, and an upper rear cover 13 configured to be opened and closed.

The lower case 11 has a front surface on which an operation panel 14 including various operation switches is provided. The lowercase 11 has a front left corner portion and a front right corner portion each provided with a hook portion 15 for engagement with each end portion of a shoulder strap (not illustrated). A user can carry the printing device 1 with the shoulder strap on his shoulder so that the printing device 1 can be used as a portable device.

Although not illustrated, as communication means, various connecting portions such as a USB port and an RS-232C connector are provided on the lower case 11 for power supply and for establishing connection to an external device (such as a personal computer and a bar code reader) to receive print data therefrom. Further, the lower case 11 also supports various communication features such as cable LAN, wireless LAN, and Bluetooth (the registered trade mark of Bluetooth SIG, Inc. USA). By receiving text data through these communication features, the printing device 1 can issue a label containing variable data (text data, and bar code data). The printing device 1 may issue labels to be used in various fields, for example, an identification tag label and a shipping label in the field of manufacturing and physical distribution, a food label and a price tag label in the field of retailing, and a specimen label and a drug history handbook label in the medical field.

Figure 2:
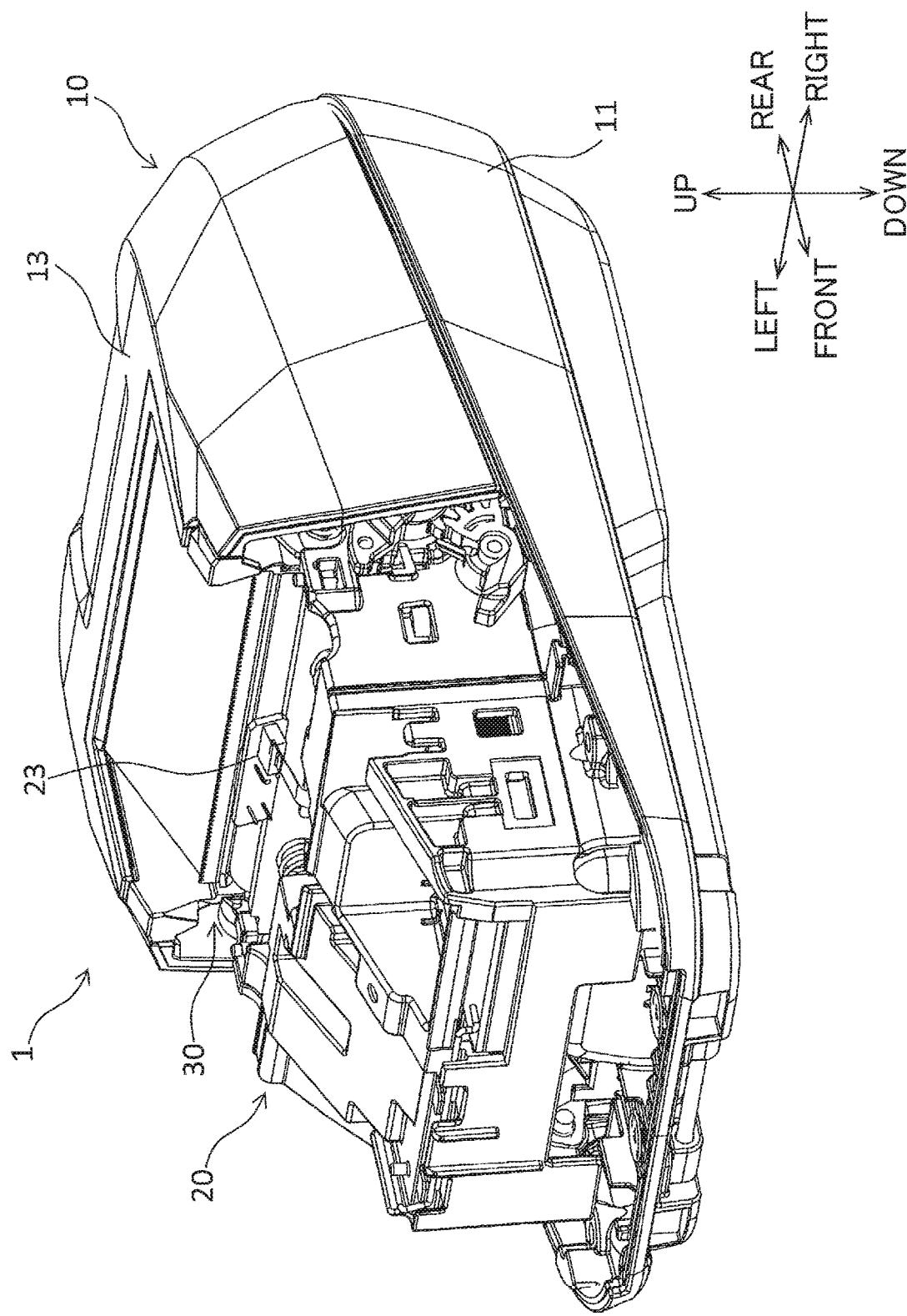
FIG. 2 is a perspective view of the printing device in a state where an upper front cover and other components are removed from the state in FIG. 1.
Figure 5:
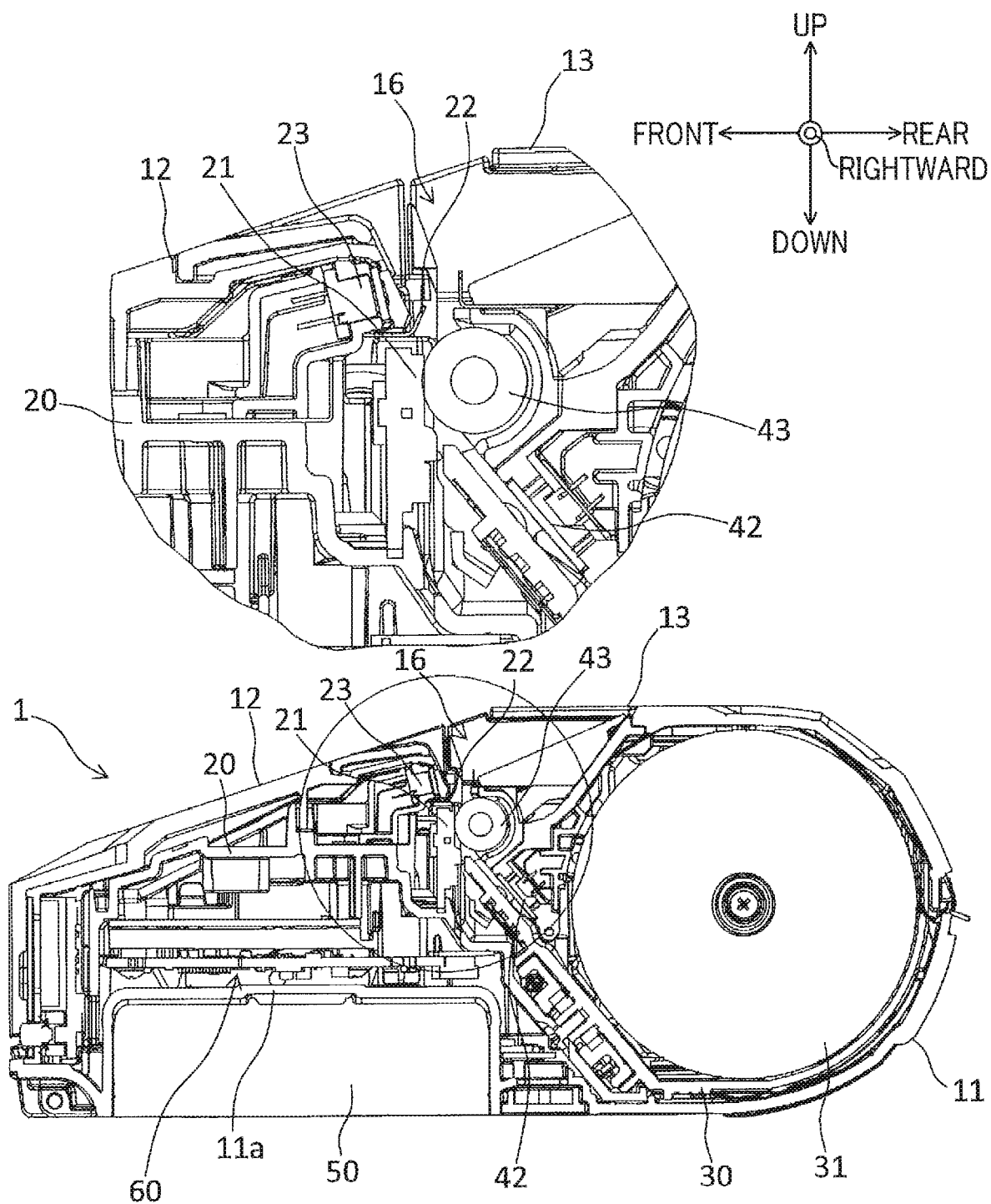
FIG. 5 is a vertical cross-sectional view of the printing device taken along a plane extending in a front-rear direction, and an enlarged cross-sectional view of an encircled portion in the cross section.

FIG. 2 illustrates a state where the upper front cover 12, the upper rear cover 13, and the hook portion 15 are removed from the state illustrated in FIG. 1. As illustrated in FIG. 2, a first frame 20 is positioned at an internal front region of the printing device 1. The first frame 20 is positioned below the upper front cover 12. As illustrated in FIG. 5, a thermal head 21, a cutter blade 22, a detector unit 23, and an electronic circuit-board unit 60 are provided on the first frame 20.

Figure 4:
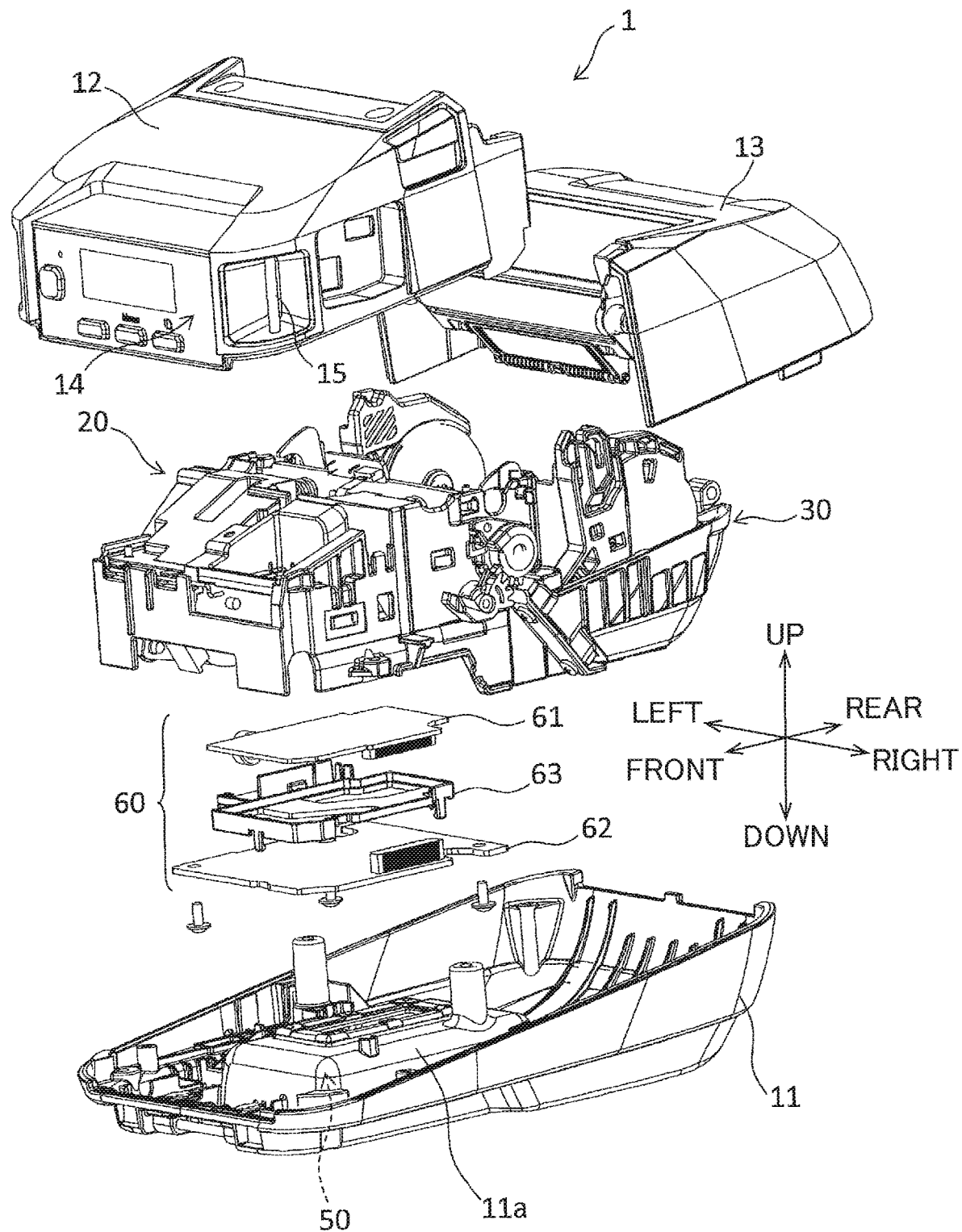
FIG. 4 is an exploded perspective view of the printing device and particularly illustrating covers, the frames, an electronic circuit-board unit, and a lower case prior to assembly thereof.

As illustrated in FIG. 4, a second frame 30 is positioned at an internal rear region of the printing device 1 such that the second frame 30 is fixed to a rear portion of the first frame 20. The second frame 30 is covered by the upper rear cover 13. The second frame 30 is configured to accommodate a tape roll 31 therein, as illustrated in FIG. 5. The second frame 30 has a rear end portion pivotally movably supported by the lower case 11. In FIG. 2, the upper rear cover 13 is at a closed position thereof. The upper rear cover 13 is movable to its open position by being pivotally moved diagonally upward and rearward from the closed position, whereby the tape roll 31 can be attached to and detached from the second frame 30.

Figure 3:
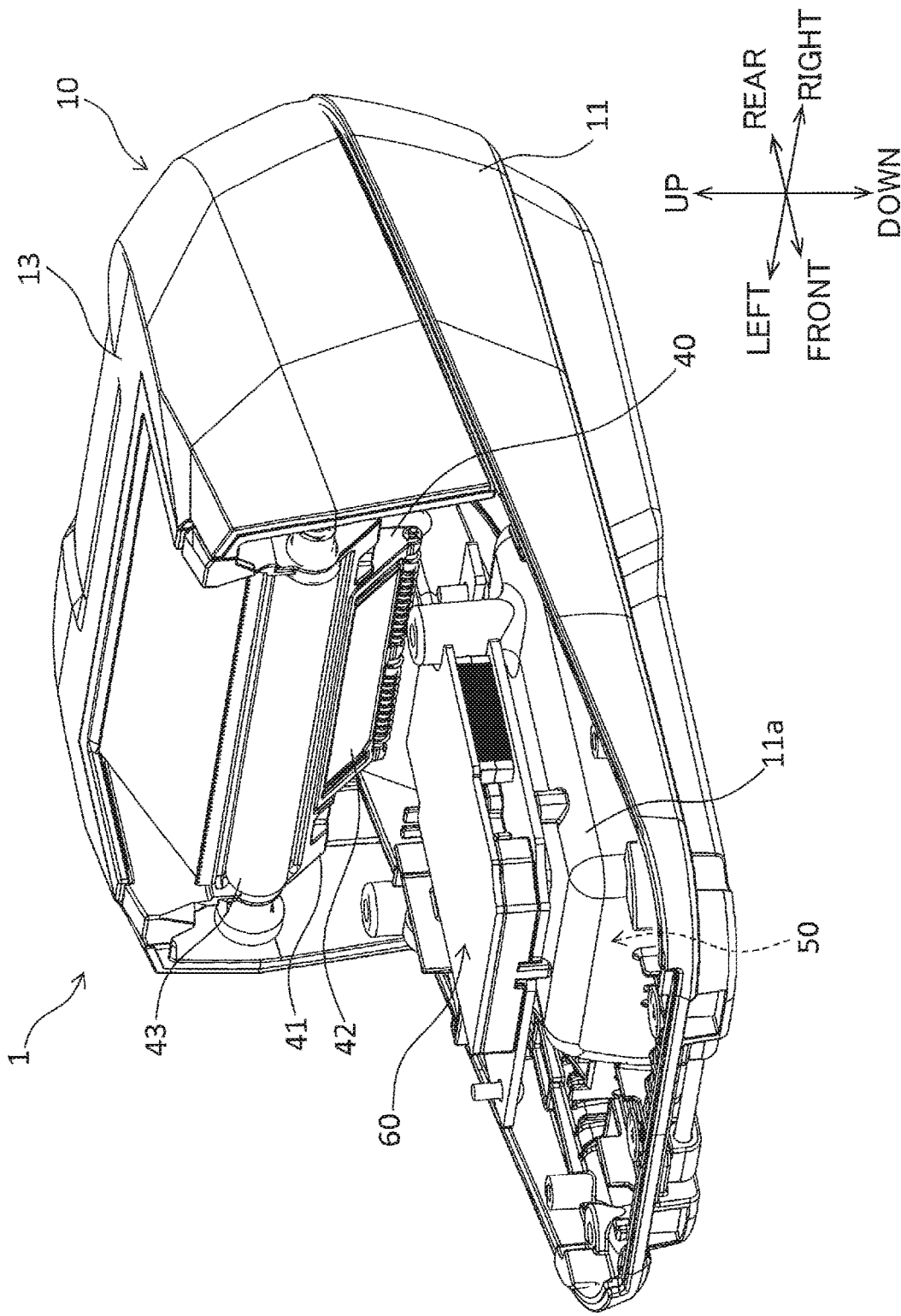
FIG. 3 is a perspective view of the printing device in a state where the upper front cover, and first and second frames are removed.

FIG. 3 illustrates a state where the first frame 20 and the second frame 30 are removed from the state illustrated in FIG. 2. As illustrated in FIG. 3, a sensor holder 40 is provided at a front end portion of the upper rear cover 13. A platen holder 41 and a sensor 42 are provided on the sensor holder 40. The platen holder 41 is positioned at the front end portion of the upper rear cover 13 through the platen holder 41. The platen holder 41 rotatably supports a platen roller 43 whose rotational axis extends in a left-right direction. The platen roller 43 is configured to convey a tape paid out from the tape roll 31 at a position to face the thermal head 21 when the upper rear cover 13 is at the closed position (see FIG. 5). The sensor 42 is a reflection-type optical sensor, and is configured to detect the tape conveyed by the platen roller 43.

The lower case 11 has a front region formed with a recessed portion 11a having a generally rectangular parallelepiped shape. The recessed portion 11a is recessed upward from a bottom surface of the lower case 11, and is configured to accommodate a battery 50 (see FIG. 5) therein. The electronic circuit-board unit 60 is positioned above the recessed portion 11a.

As illustrated in FIG. 4, the electronic circuit-board unit 60 is positioned below the first frame 20, and the first frame 20 and the second frame 30 are accommodated in a front region and a rear region of the lower case 11, respectively. Hence, the electronic circuit-board unit 60 is interposed between the first frame 20 and the recessed portion 11a, i.e., the electronic circuit-board unit 60 is positioned below the first frame 20 and above the recessed portion 11a. The upper front cover 12 and the upper rear cover 13 are connected to the lower case 11 such that the upper front cover 12 and the upper rear cover 13 cover the first frame 20 and the second frame 30, respectively.

As illustrated in FIG. 5, the battery 50 is configured to feed an electric power changed therein to each driving portion of the printing device 1 when accommodated in the recessed portion 11a of the lower case 11. The electronic circuit-board unit 60 positioned above the recessed portion 11a has a generally flat plate shape, and is provided on the first frame 20 so as to extend horizontally in the left-right direction and in a front-rear direction. The electronic circuit-board unit 60 is configured to perform drive control in the printing device 1.

As illustrated in the enlarged view encircled in FIG. 5, the thermal head 21 is positioned above the electronic circuit-board unit 60 and rearward of the first frame 20. The thermal head 21 extends in the left-right direction to face the platen roller 43, and is configured to print a character (characters) on a heat sensitive label of the tape through application of heat. The cutter blade 22 is positioned above the thermal head 21. The cutter blade 22 extends in the left-right direction and is configured to cut away a printed part of the tape from a remaining part of the tape.

The second frame 30 is fixed to a rear end portion of the first frame 20. The second frame 30 is configured to accommodate the tape roll 31 therein. The tape roll 31 includes a sleeve like core and a tape wound over the core. The tape includes a base tape and a plurality of heat sensitive labels discretely releasably affixed to the base tape. The second frame 30 includes a support portion configured to support respective left and right end faces of the tape roll 31. That is, the tape roll 31 is rotatably supported by the support portion in such a posture that an axis of the tape roll 31 extends in the left-right direction.

The rear end portion of the upper front cover 12 and the front end portion of the upper rear cover 13 are spaced apart from each other, providing a discharge opening 16 (see FIG. 5) therebetween. The tape paid out from the tape roll 31 is configured to be discharged through the discharge opening 16 after printing is performed on the tape. The detector unit 23 including the optical sensor is positioned frontward of the cutter blade 22, and is configured to detect the tape discharged through the discharge opening 16, i.e., the printed label.

The user can pinch a leading end portion of the tape (printed label) discharged through the discharge opening 16 with his fingers and can cut off the printed tape using the cutter blade 22, after the label is created with a desired print data. Further, even in a case where a tape roll configured by a heat sensitive tape without a base tape is wound over a core (a receipt slip, for example) is to be used instead of the tape roll 31, the printed portion of the tape can be cut off from a remaining portion of the tape roll.

<Positional Relationship between First Frame 20 and Electronic Circuit-Board Unit 60>

Figure 6:
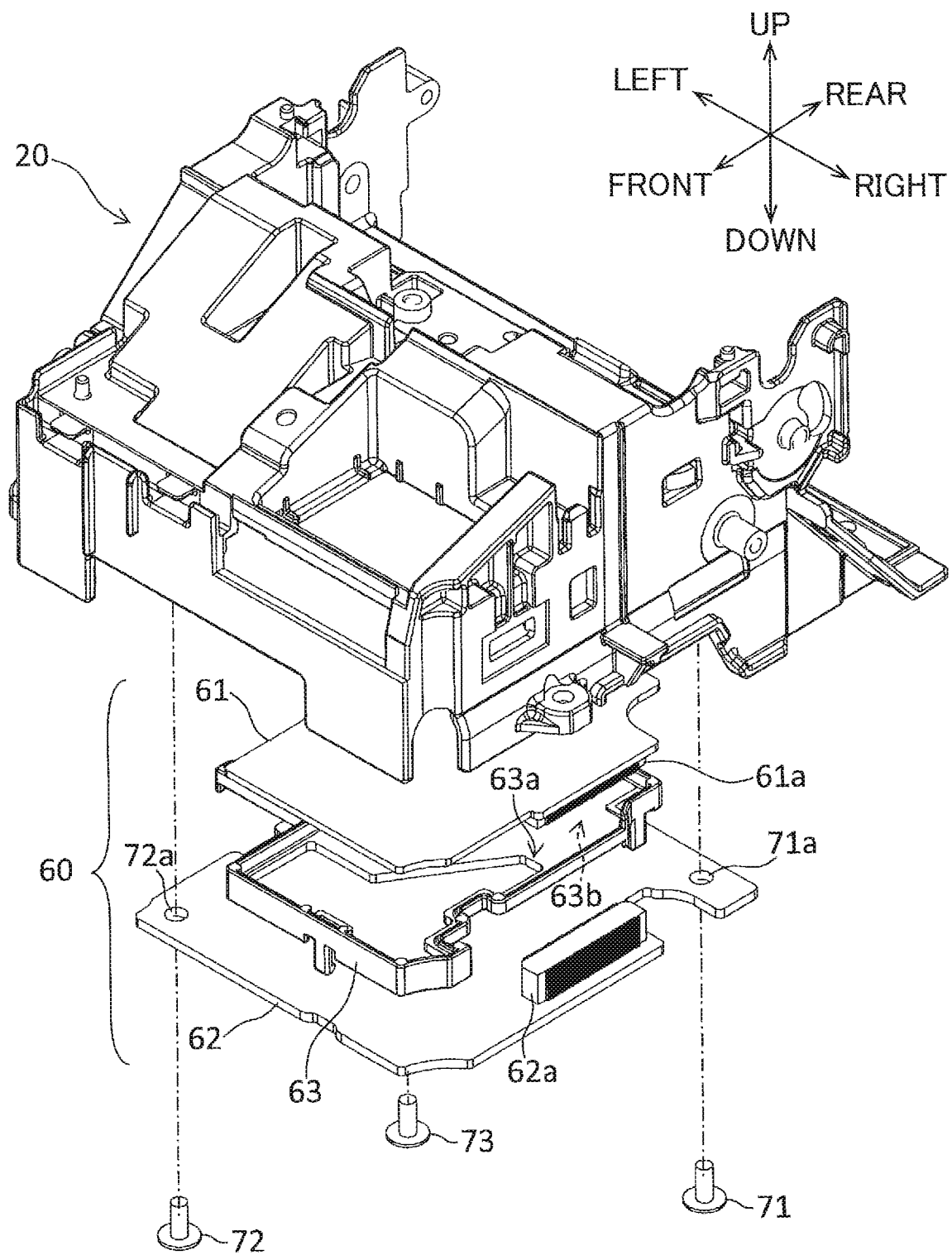
FIG. 6 is a perspective view of the electronic circuit-board unit and the first frame.

As illustrated in FIG. 6, the electronic circuit-board unit 60 is mounted on the first frame 20. The first frame 20 is made of fiber-reinforced resin containing glass fiber to provide a high rigidity. As described above, parts and components other than the electronic circuit-board unit 60 such as the thermal head 21, the cutter blade 22, the detector unit 23 are also provided at the first frame 20.

The electronic circuit-board unit 60 includes a first substrate 61, a second substrate 62, and a holder 63.

The first substrate 61 and the second substrate 62 are flat plates each having a generally rectangular shape in a plan view. In a plan view, the first substrate 61 has an area smaller than an area of the second substrate 62. Electronic parts such as IC chip are surface-mounted on the first substrate 61 and the second substrate 62. The first substrate 61 and the second substrate 62 are electrically connected to each other through electrical connection between a first connector 61a provided on the first substrate 61 and a second connector 62a provided on the second substrate 62. Further, the second substrate 62 is electrically connected to the detector unit 23 and the sensor 42 through a harness H (see FIG. 19B). Through these electrical connections, the overall operation of the printing device 1 is thus configured to be controlled.

The holder 63 is made from resin. The holder 63 has a first surface 63a and a second surface 63b opposite to the first surface 63a. The first surface 63a is positioned closer to the first frame 20 than the second surface 63b is to the first frame 20. The first surface 63a faces and holds the first substrate 61, and the second surface 63b faces and holds the second substrate 62. With the first substrate 61 and the second substrate 62 held respectively to the first surface 63a and the second surface 63b, the second substrate 62 is fixed to a lower end of the first frame 20 from below by three screws 71, 72, and 73.

Next, the positional relationship between the first frame 20 and the electronic circuit-board unit 60 in a fixed state of the electronic circuit-board unit 60 to the first frame 20 will be described with reference to FIGS. 7 through 15.

Figure 7:
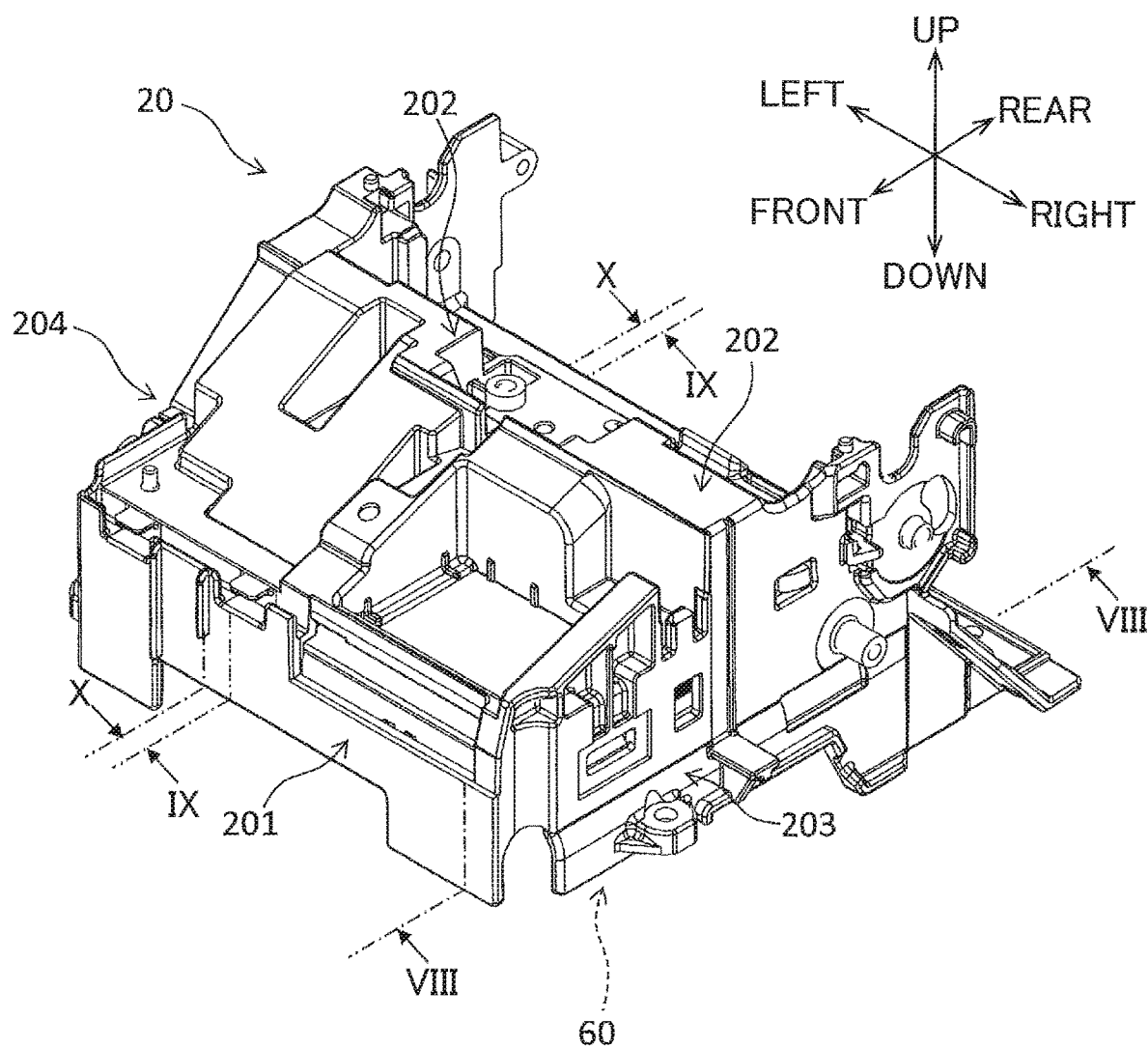
FIG. 7 is a perspective view of the first frame to which the electronic circuit-board unit is fixed.
Figure 14:
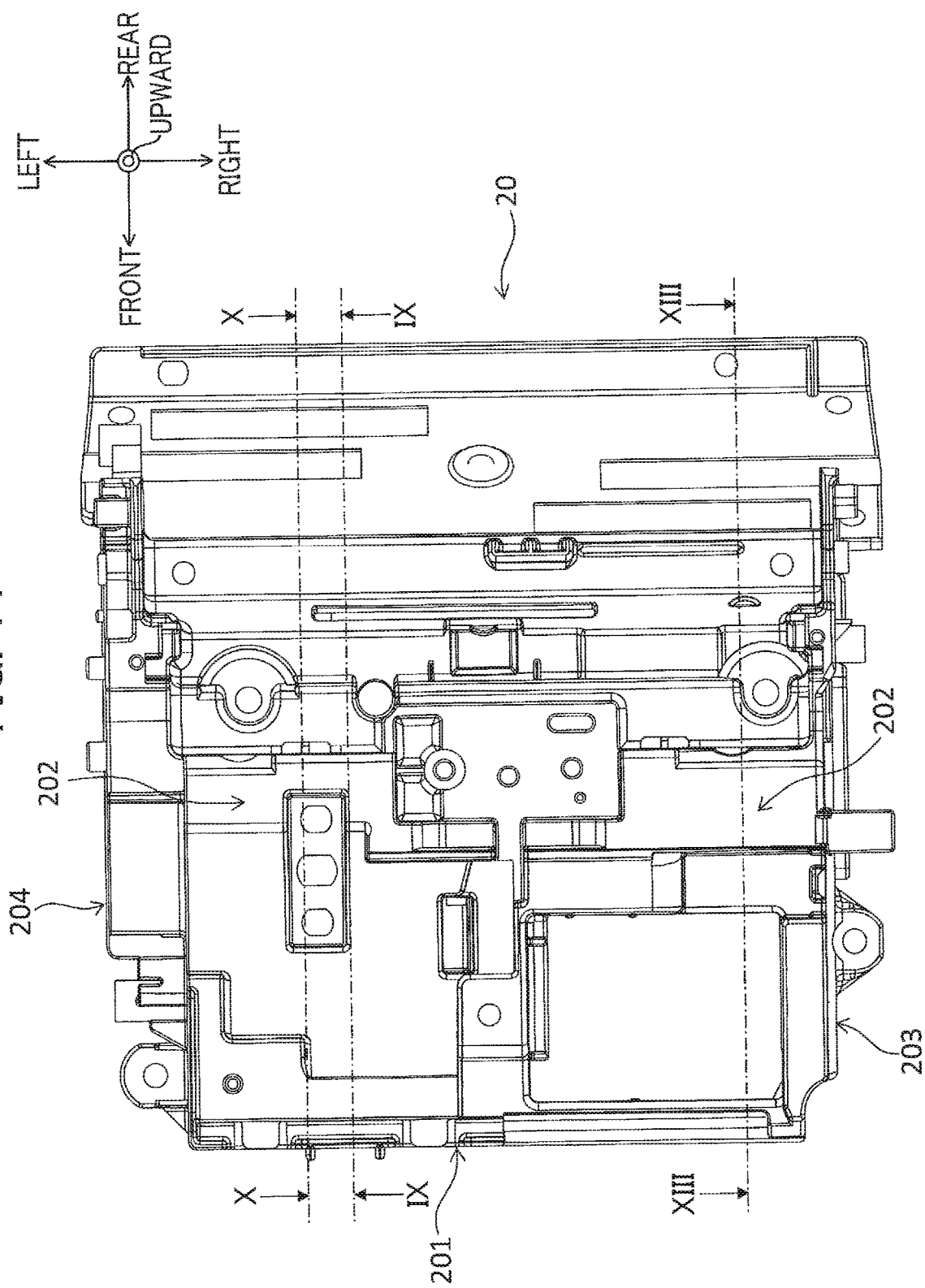
FIG. 14 is a plan view of the first frame and the electronic circuit-board unit illustrated in FIG. 7.
Figure 15:
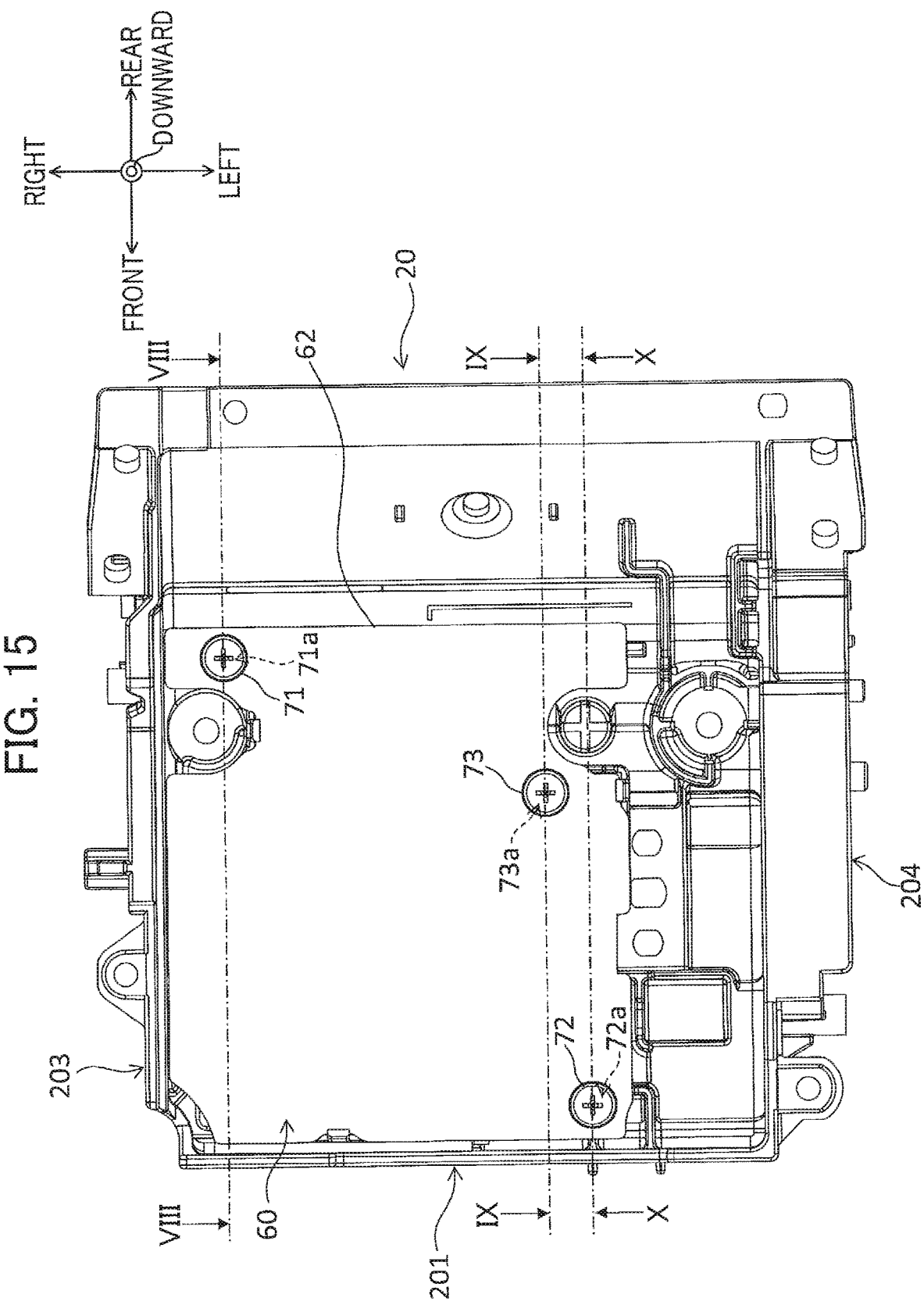
FIG. 15 is a bottom view of the first frame and the electronic circuit-board unit illustrated in FIG. 7.

As illustrated in FIGS. 7 and 14, the first frame 20 has a front end surface 201, an upper end surface 202, a right end surface 203, and a left end surface 204. The first frame 20 has a generally rectangular shape in a plan view. As illustrated in FIG. 15, the electronic circuit-board unit 60 is not centered on the first frame 20 but is deviated toward its right front side such that a front end and a right end of the second substrate 62 are aligned with the front end surface 201 and the right end surface 203 of the first frame 20, respectively.

As illustrated in FIGS. 6, and 18A through 21, the second substrate 62 is formed with a first through-hole 71a, a second through-hole 72a, and a third through-hole 73a. The screws 71, 72, and 73 extend through the first through-hole 71a, the second through-hole 72a and the third through-hole 73a, respectively. The first through-hole 71a is positioned at a right rear end region of the second substrate 62, and the second through-hole 72a is positioned at a left front end region of the second substrate 62. The third through-hole 73a is positioned offset toward the rear end of the second substrate 62 from a front-rear center thereof, and frontward of the first through-hole 71a. Further, the third through-hole 73a is positioned closer to the left end of the second substrate 62 than to the right end of the second substrate 62, and rightward of the second through-hole 72a.

Incidentally, the first frame 20 is formed with three screw holes at positions corresponding to the positions of the three through-holes 71a, 72a, and 73a. These three screw holes are threadingly engageable with the screws 71, 72, 73, respectively. Hence, the electronic circuit-board unit 60 is fixed to the first frame 20 by the screws 71, 72, and 73 threadingly engaged with the respective screw holes through the through-holes 71a, 72a, 73a. In the following description, the vertical planes VIII-VIII, IX-IX, and X-X indicated in FIGS. 7, 14, and 15 will be referred to as cross-sections of the first frame 20 and the electronic circuit-board unit 60, the cross-sections extending in the front-rear direction and passing through the screws 71, 73, 72, respectively.

Figure 8:
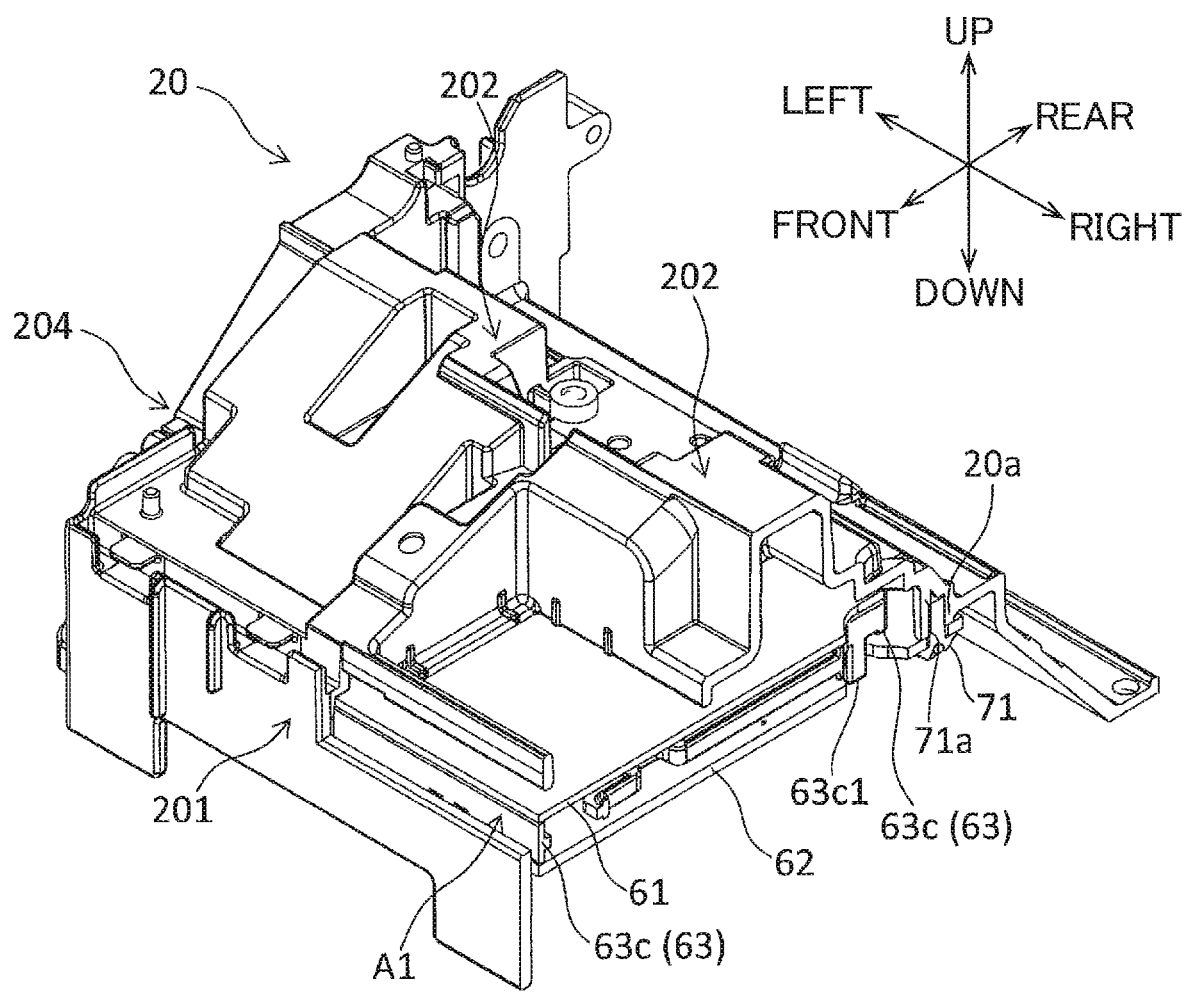
FIG. 8 is a perspective view of the first frame and the electronic circuit-board unit and illustrating a cross section thereof taken along a plane VIII-VIII in FIG. 7.
Figure 17A:
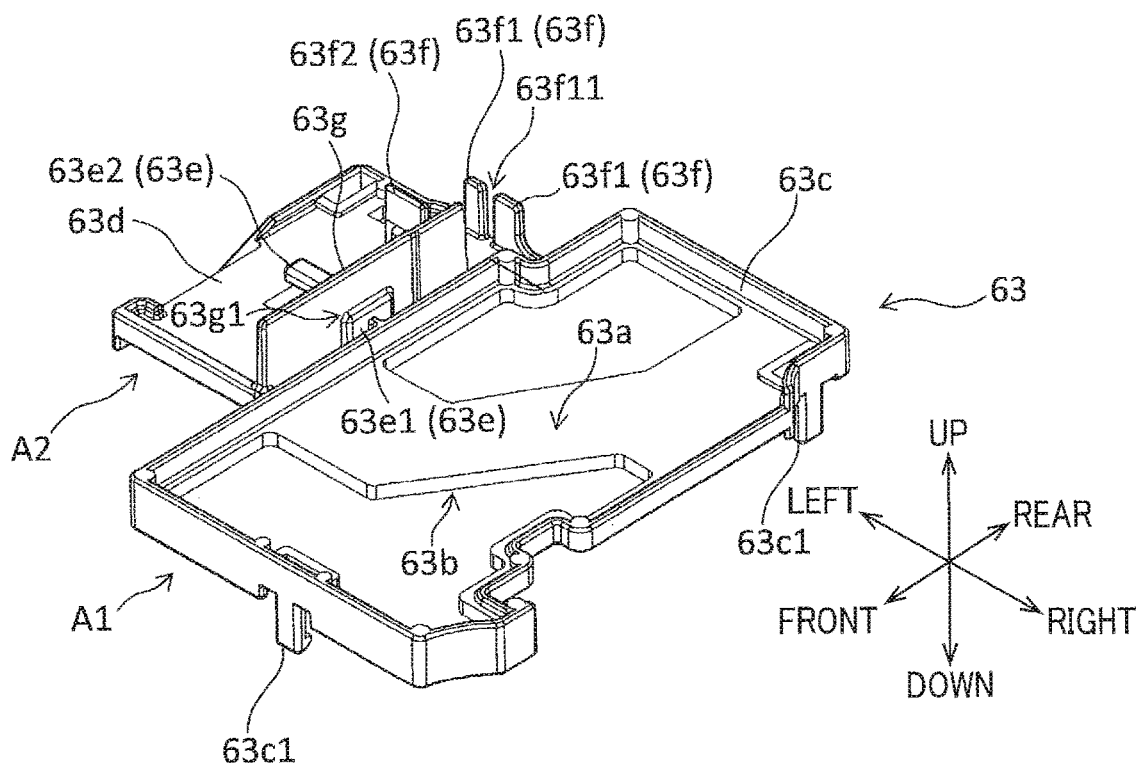
FIG. 17A is a perspective view of the holder.
Figure 18A:
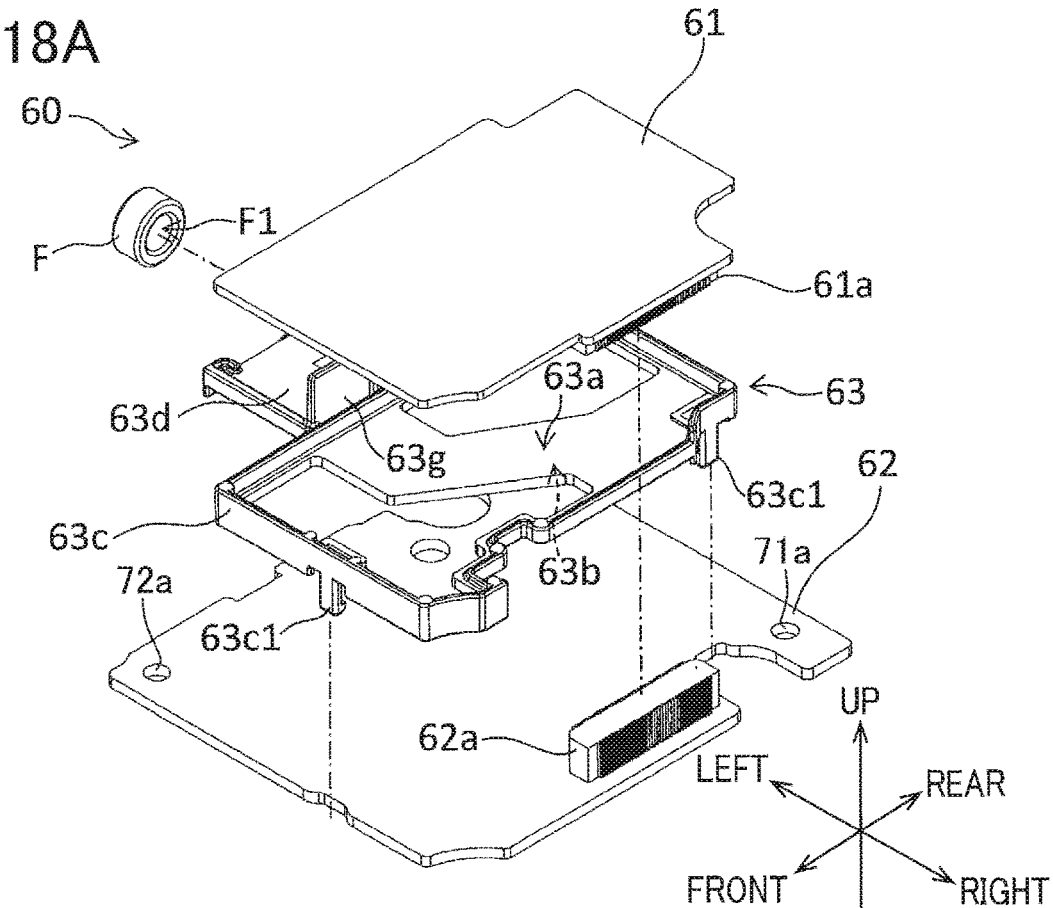
FIG. 18A is an exploded perspective view of the electronic circuit-board unit as viewed from a diagonally right front upper side with respect to the electronic circuit-board unit.

The holder 63 includes a rim or a collar portion 63c (see FIGS. 17A and 18A). As illustrated in FIG. 8 (a perspective cross-sectional view taken along the plane VIII-VIII in FIG. 7) and FIG. 11 (a vertical cross-sectional view taken along the plane VIII-VIII), the lower end of the first substrate 61 is in contact with an upper end of the collar portion 63c, and the upper end of the second substrate 62 is in contact with a lower end of the collar portion 63c.

Figure 18B:
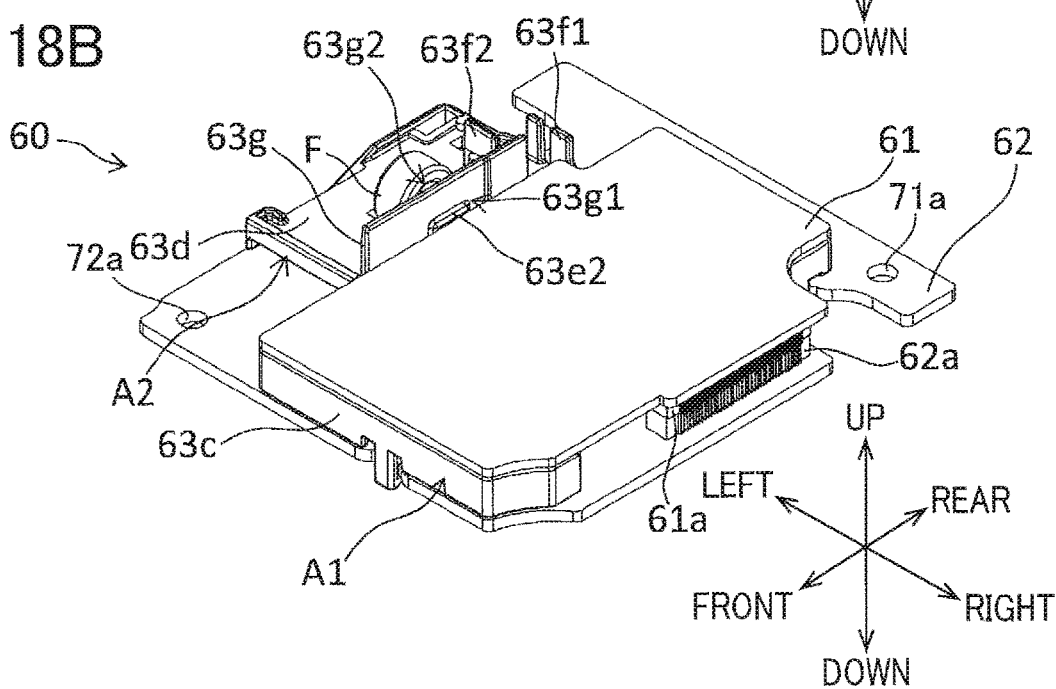
FIG. 18B is a perspective view of the electronic circuit-board unit as viewed in the same direction as in FIG. 18A.
Figure 19A:
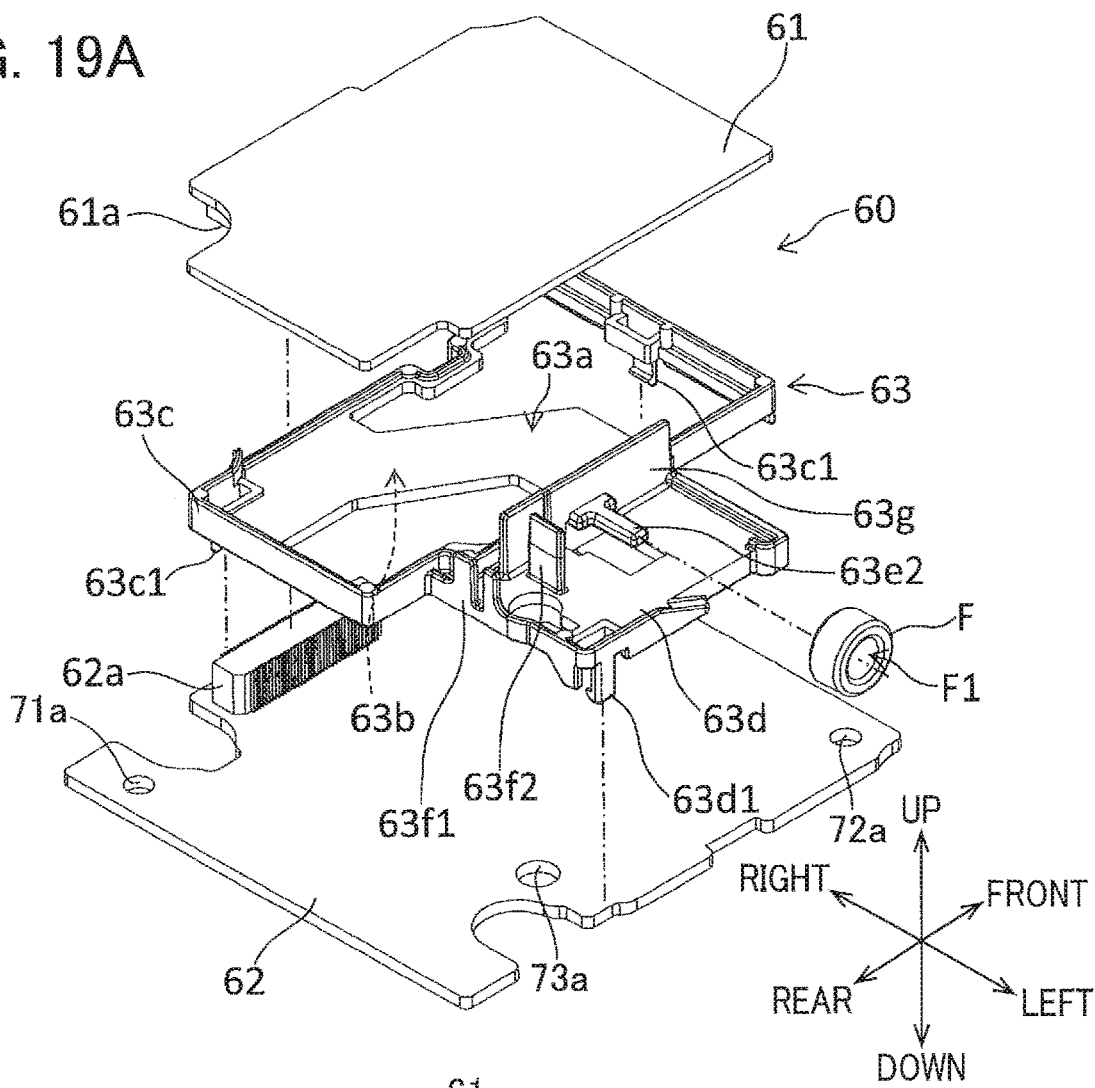
FIG. 19A is an exploded perspective view of the electronic circuit-board unit as viewed from a diagonally left rear upper side with respect to the electronic circuit-board unit.
Figure 19B:
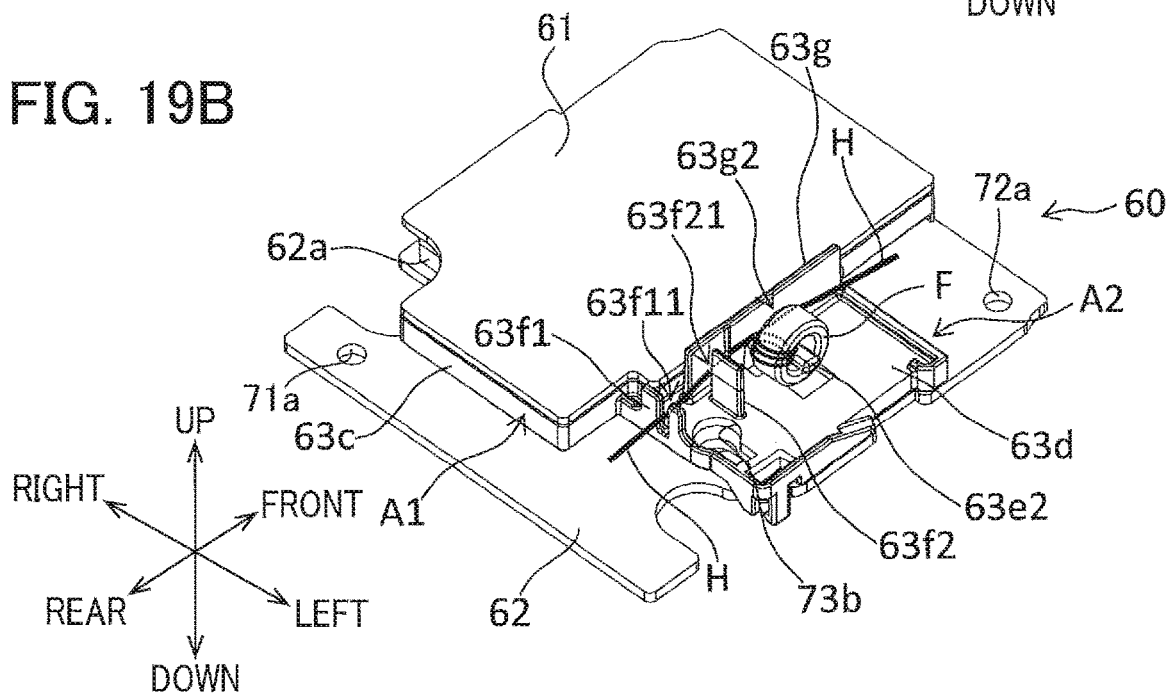
FIG. 19B is a perspective view of the electronic circuit-board unit as viewed in the same direction as in FIG. 19A.
Figure 20:
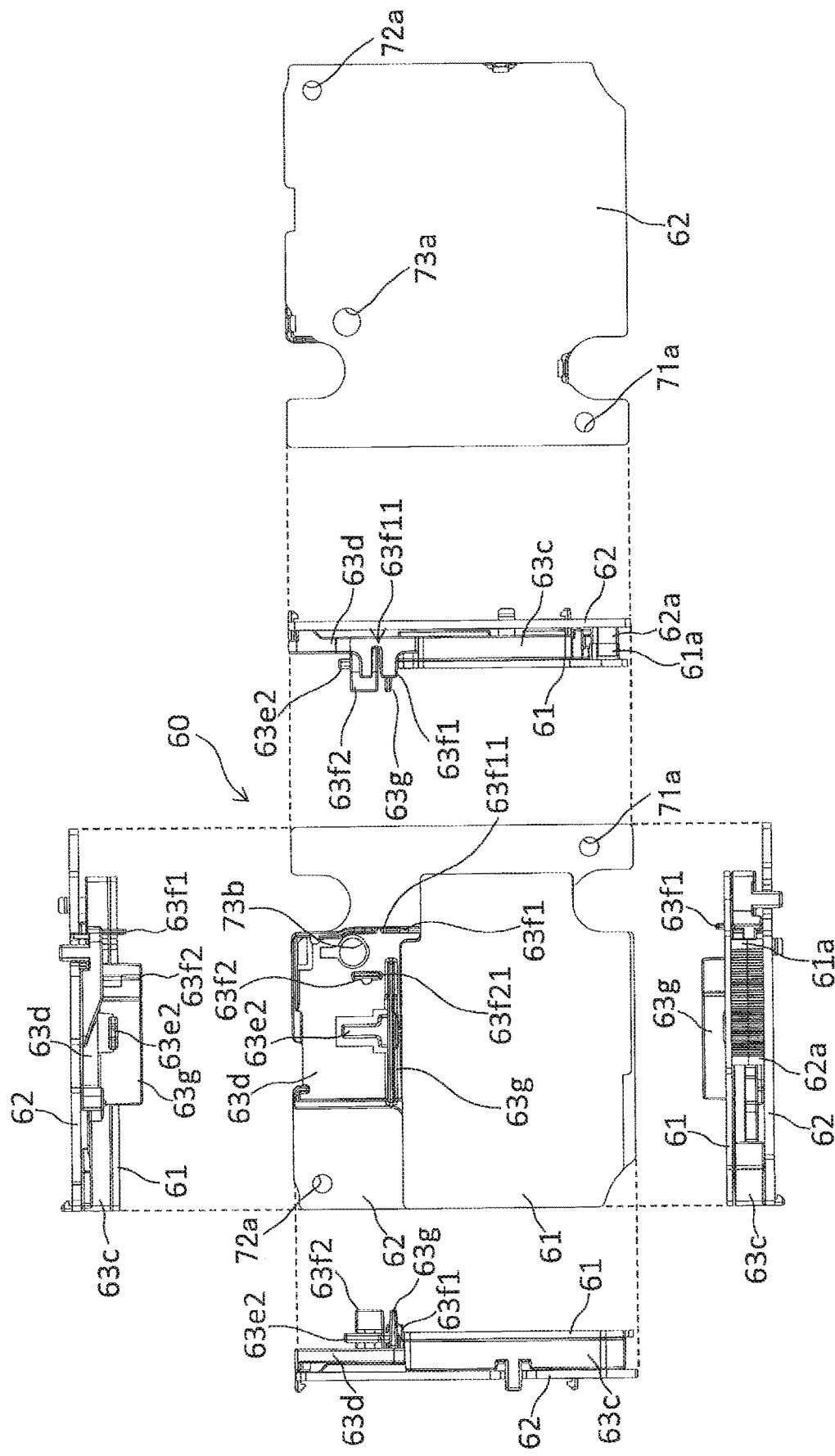
FIG. 20 contains a front view, a rear view, a right side view, a left side view, a plan view and a bottom view of the electronic circuit-board unit.

The collar portion 63c of the holder 63 is interposed between the first substrate 61 and the second substrate 62 such that a front end of the collar portion 63c is aligned with a front end of the first substrate 61 and a front end of the second substrate 62, as illustrated in FIGS. 18B and 19B. Further, a rear end of the collar portion 63c is aligned with a rear end of the first substrate 61 and a region of the second substrate 62 frontward of the first through-hole 71a, as illustrated in FIGS. 18B and 19B.

The front end portion of the collar portion 63c has a lower end from which a protrusion 63c1 protrudes downward. Further, the rear end portion collar portion 63c has a lower end from which another protrusion 63c1 protrudes downward. These protrusions 63c1 are engaged with a front portion and a right rear portion of the second substrate 62, respectively.

The first frame 20 includes a first substrate supporting portion 20a. The first substrate supporting portion 20a is positioned at a generally front-rear center portion of the first frame 20 and rearward of the rear end of the collar portion 63c. The first substrate supporting portion 20a extends downward from the upper end surface 202, and is formed with a female thread hole opened at a lower end face of the first substrate supporting portion 20a. The lower end face of the first substrate supporting portion 20a is in abutment with the upper surface of the second substrate 62. The second substrate 62 is screw-fixed to the first substrate supporting portion 20a of the first frame 20 by the screw 71 extending through the first through-hole 71a and threadingly engaged with the female thread hole of the first substrate supporting portion 20a.

In this way, the first substrate 61 and the second substrate 62 are disposed generally in parallel with the first surface 63a and the second surface 63b of the holder 63 while the first substrate 61 and the second substrate 62 interpose the collar portion 63c therebetween, as illustrated in FIG. 6. The first surface 63a faces the first frame 20, and the second surface 63b opposite to the first surface 63a faces the second substrate 62, as described above.

Hereinafter, referring to FIGS. 18B and 19B, a region of the holder 63 overlapping with the first substrate 61 in a plan view will be referred to as a first region A1, and a region of the holder 63 that does not overlap with the first substrate 61 in a plan view will be referred to as a second region A2. That is, the second region A2 is a region offset from the first region A1 in a plan view.

Figure 16:
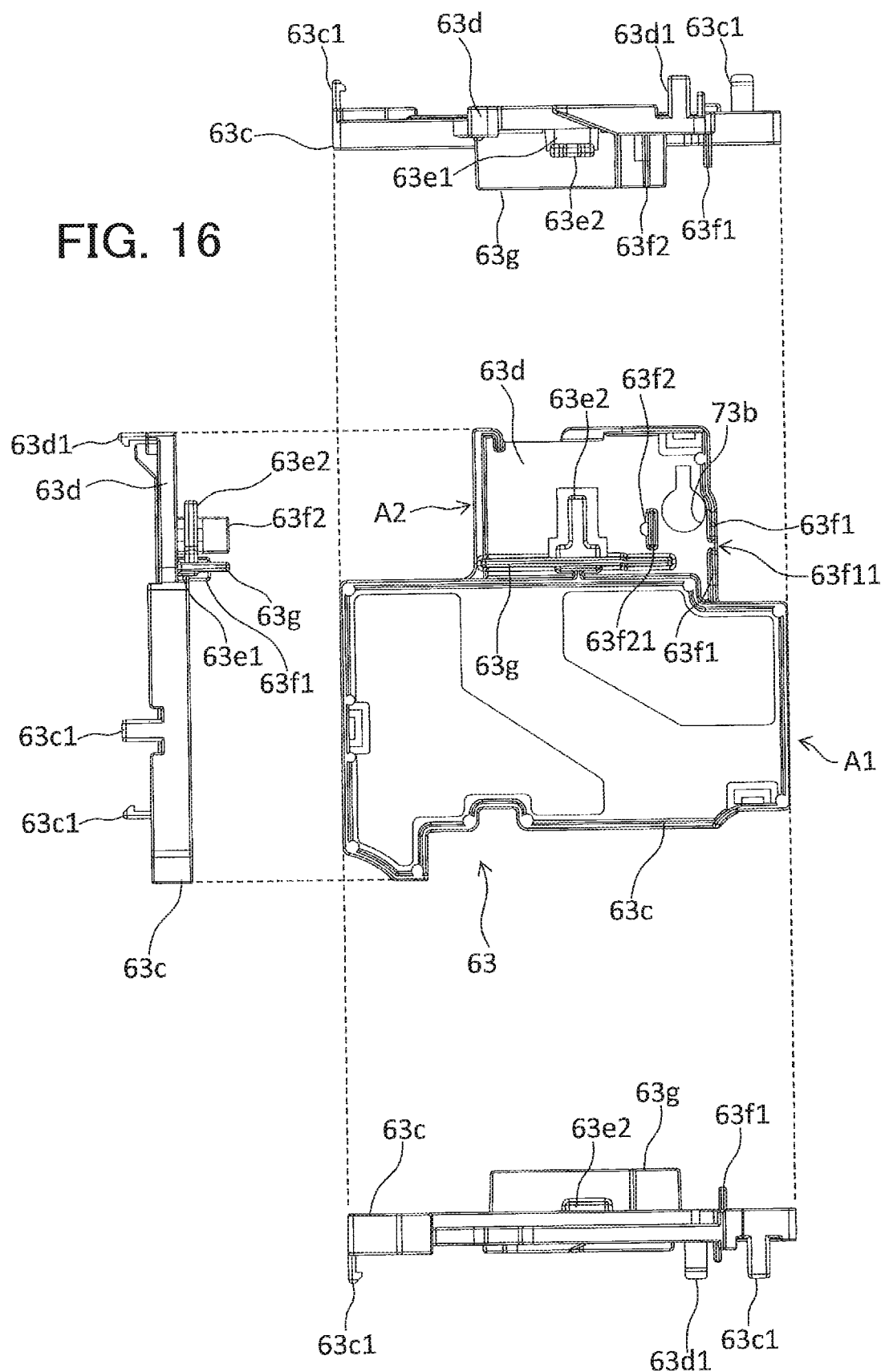
FIG. 16 contains a left side view, a front view, a right side view, and a plan view of a holder provided in the electronic circuit-board unit.

As illustrated in FIGS. 16, 17A, and 18A, the holder 63 further includes a holding plate portion 63d. As illustrated in FIG. 19A, the holding plate portion 63d extends horizontally leftward from the left end of the collar portion 63c, and is integral with the collar portion 63c.

Figure 9:
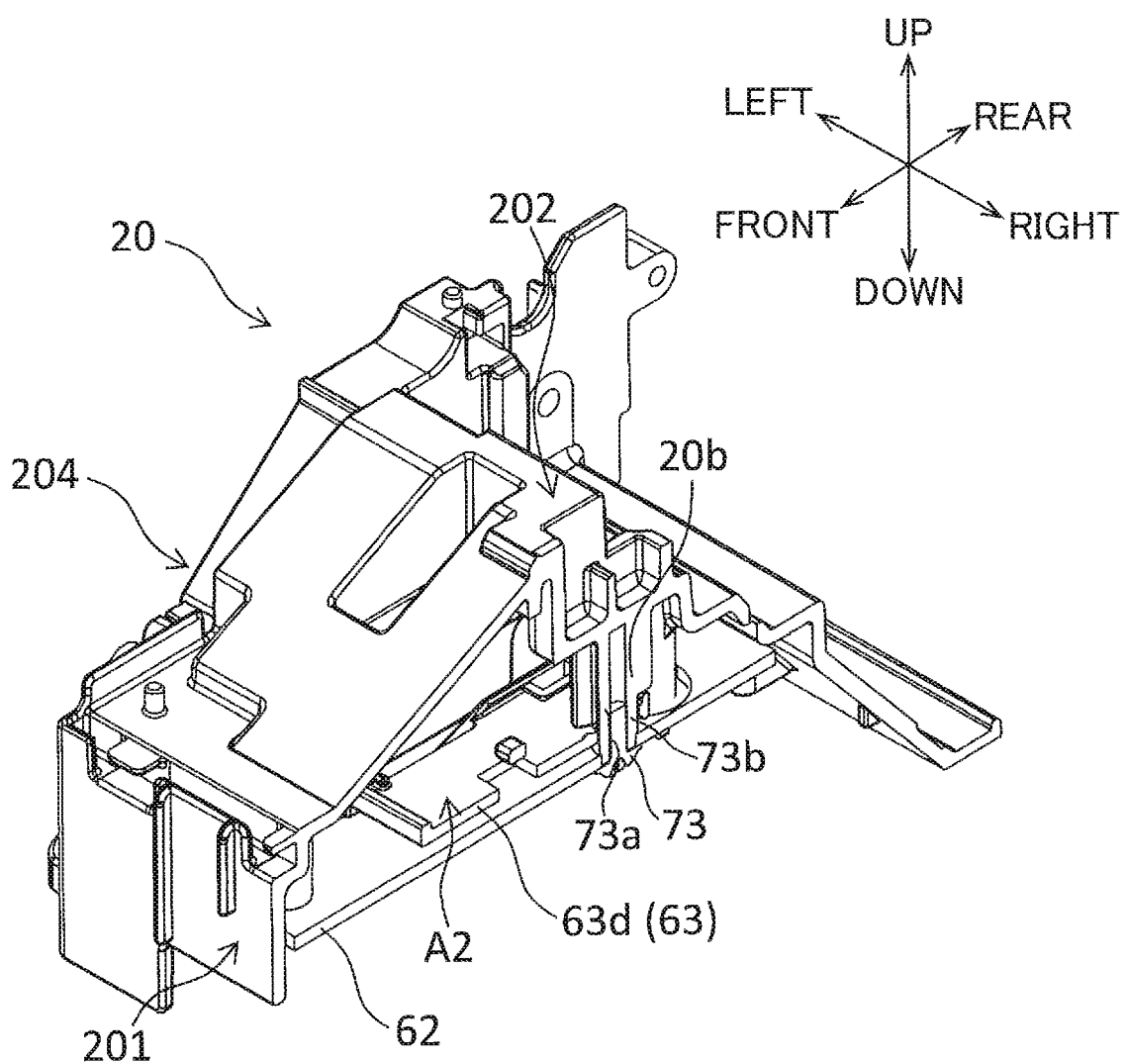
FIG. 9 is a perspective view of the first frame and the electronic circuit-board unit and illustrating a cross section thereof taken along a plane IX-IX in FIG. 7.
Figure 12:
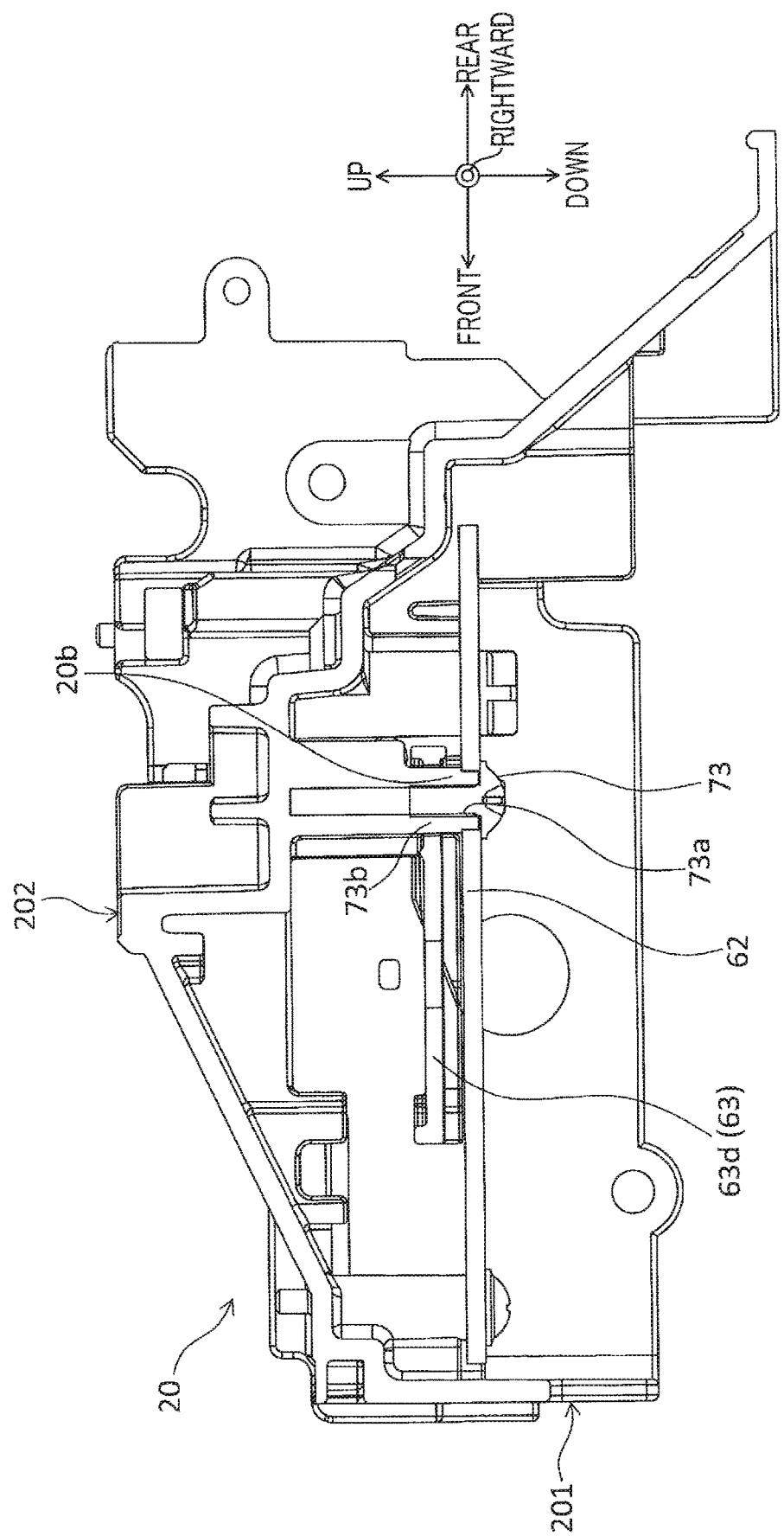
FIG. 12 is a vertical cross-sectional view of the first frame and the electronic circuit-board unit taken along the plane IX-IX in FIG. 7.
Figure 13:
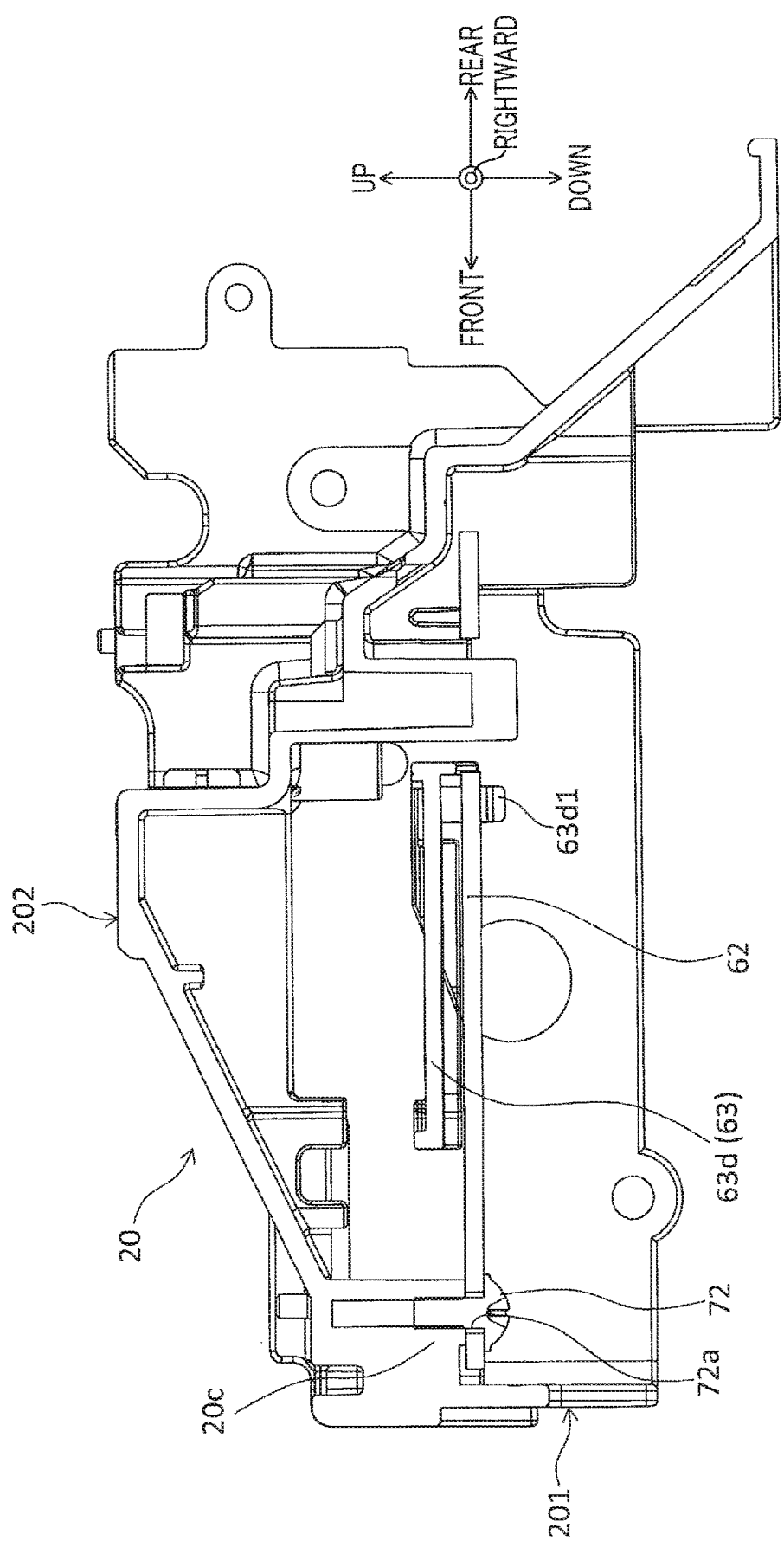
FIG. 13 is a vertical cross-sectional view of the first frame and the electronic circuit-board unit taken along the plane X-X in FIG. 7.

As illustrated in FIG. 9 (a perspective cross-sectional view taken along the plane IX-IX in FIG. 7) and FIG. 12 (a vertical cross-sectional view taken along the plane IX-IX), the holding plate portion 63d has a lower end facing the upper end of the second substrate 62. However, the holding plate portion 63d is positioned so as not to overlap with the first substrate 61 in a plan view, as illustrated in FIG. 19B. That is, the holding plate portion 63d is arranged in the second region A2 of the holder 63. The holding plate portion 63d is disposed at a generally front-rear center portion of the second substrate 62 and at a left end portion of the second substrate 62.

The holding plate portion 63d has a rear region where a through-hole 73b is formed. The through-hole 73b is in alignment with the third through-hole 73a of the second substrate 62 in an up-downward direction. Referring to FIGS. 9 and 12, the first frame 20 includes a second substrate supporting portion 20b at a generally front-rear center portion of the first frame 20 and frontward of the rear end of the holding plate portion 63d. The second substrate supporting portion 20b extends downward from the upper end surface 202 and is formed with a female thread hole opened at a lower end face of the second substrate supporting portion 20b.

The second substrate supporting portion 20b extends through the through-hole 73b of the holding plate portion 63d, and a lower end portion of the second substrate supporting portion 20b is fitted with the third through-hole 73a of the second substrate 62. The second substrate 62 is screw-fixed to the second substrate supporting portion 20b of the first frame 20 by the screw 73 extending through the third through-hole 73a and threadingly engaged with the female thread hole of the second substrate supporting portion 20b. Hence, the second substrate 62 is disposed generally in parallel with the lower surface of the holding plate portion 63d in the second region A2.

Figure 10:
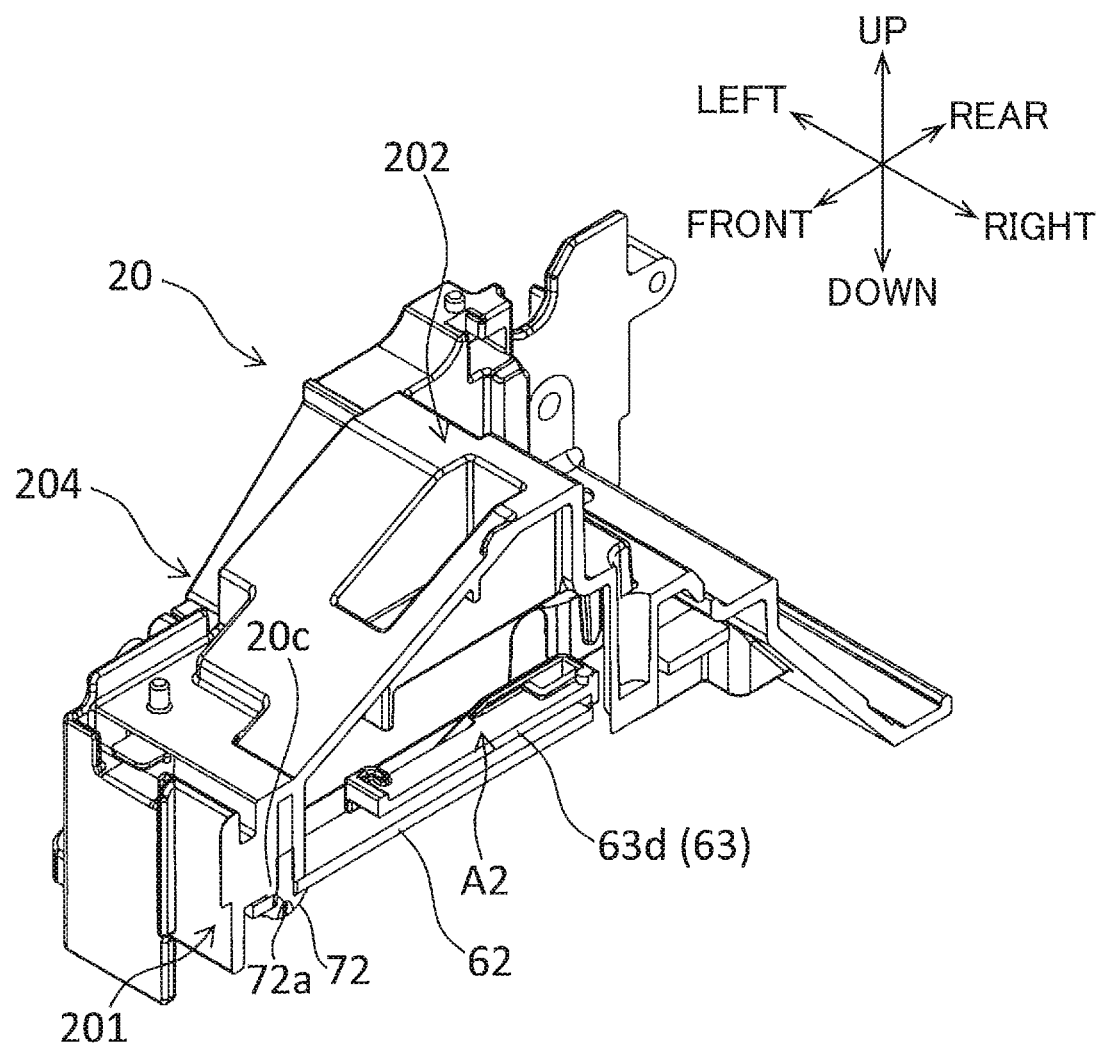
FIG. 10 is a perspective view of the first frame and the electronic circuit-board unit and illustrating a cross section thereof taken along a plane X-X in FIG. 7.
Figure 11:
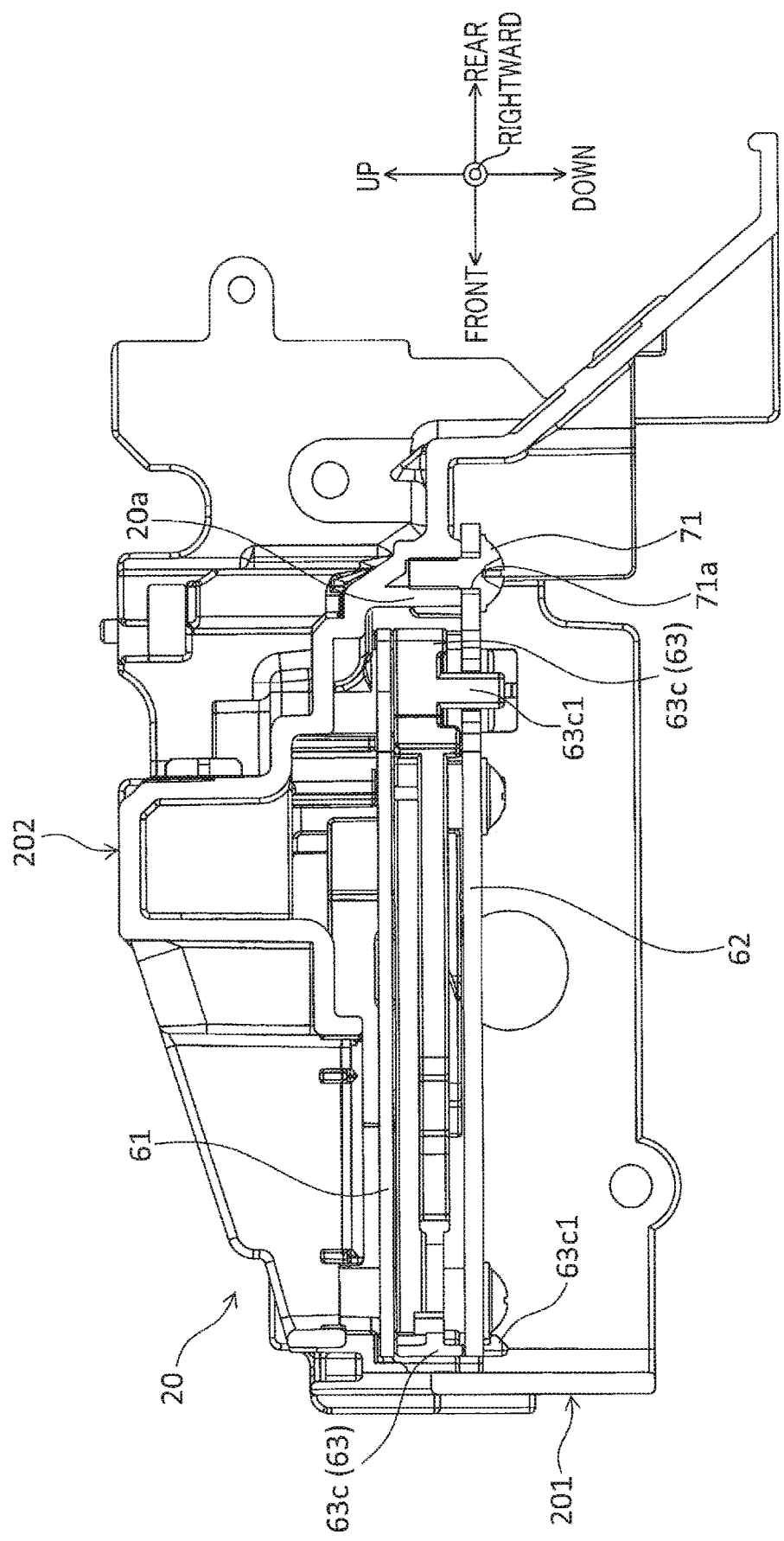
FIG. 11 is a vertical cross-sectional view of the first frame and the electronic circuit-board unit taken along the plane VIII-VIII in FIG. 7.

Similar to the cross-section taken along the plane IX-IX, the upper end of the second substrate 62 faces the lower end of the holding plate portion 63d, as illustrated in FIG. 10 (a perspective cross-sectional view taken along the plane X-X in FIGS. 7) and 13 (a vertical cross-sectional view taken along the plane X-X). The second region A2 of the holder 63 extends leftward beyond the plane X-X. That is, the holding plate portion 63d extends leftward beyond the plane X-X.

The first frame 20 includes a third substrate supporting portion 20c. The third substrate supporting portion 20c is at a front end portion of the first frame 20 and frontward of the front end of the holding plate portion 63d. The third substrate supporting portion 20c extends downward from the upper end surface 202 and is formed with a female thread hole opened at a lower end face of the third substrate supporting portion 20c. The lower end face of the third substrate supporting portion 20c is in contact with the upper end of the second substrate 62. The second substrate 62 is screw-fixed to the third substrate supporting portion 20c of the first frame 20 by the screw 72 extending through the second through-hole 72a and threadingly engaged with the female thread hole of the third substrate supporting portion 20c.

In this way, the second substrate 62, which constitutes a lowermost portion in the electronic circuit-board unit 60, is fixed to the first through third substrate supporting portions 20a, 20b, 20c of the first frame 20. The electronic circuit-board unit 60 is positioned below the first frame 20 such that the electronic circuit-board unit 60 is surrounded by the front end surface 201, the upper end surface 202, the right end surface 203, and the left end surface 204.

<Detailed Structure of the Electronic Circuit-board Unit 60>

Details of the electronic circuit-board unit 60 will be described next with reference to FIGS. 16 through 21.

As described above, the electronic circuit-board unit 60 includes the holder 63, the first substrate 61 facing the first surface 63a of the holder 63 and held to the holder 63, and the second substrate 62 attached to the first frame 20 and facing the second surface 63b of the holder 63 and held to the holder 63.

Further, as illustrated in FIGS. 16 and 17A, the holder 63 is divided into the first region A1 (overlapped with the first substrate 61 in a plan view) and the second region A2 (not overlapped with the first substrate 61 in a plan view). The holder 63 is an integral component in the embodiment, but the holder 63 may be an assembly of a first member providing the first region A1 and a second member providing the second region A2 adhered to or joined to each other.

In the first region A1 of the holder 63, the collar portion 63c is provided. The collar portion 63c has a generally rectangular shape in a plan view. The collar portion 63c has a predetermined length in the up-downward direction, as shown in its left side view, front view, and right side view of FIG. 16, and in its rear view of FIG. 17B. Further, the collar portion 63c has an outer profile in conformance with an outer profile of the first substrate 61 in a plan view, as shown in a plan view of FIG. 16 and a bottom view of FIG. 17 of the collar portion 63c. As shown in FIG. 18A, an edge portion of the lower end of the first substrate 61 is in contact with the upper end of the collar portion 63c.

Figure 17B:
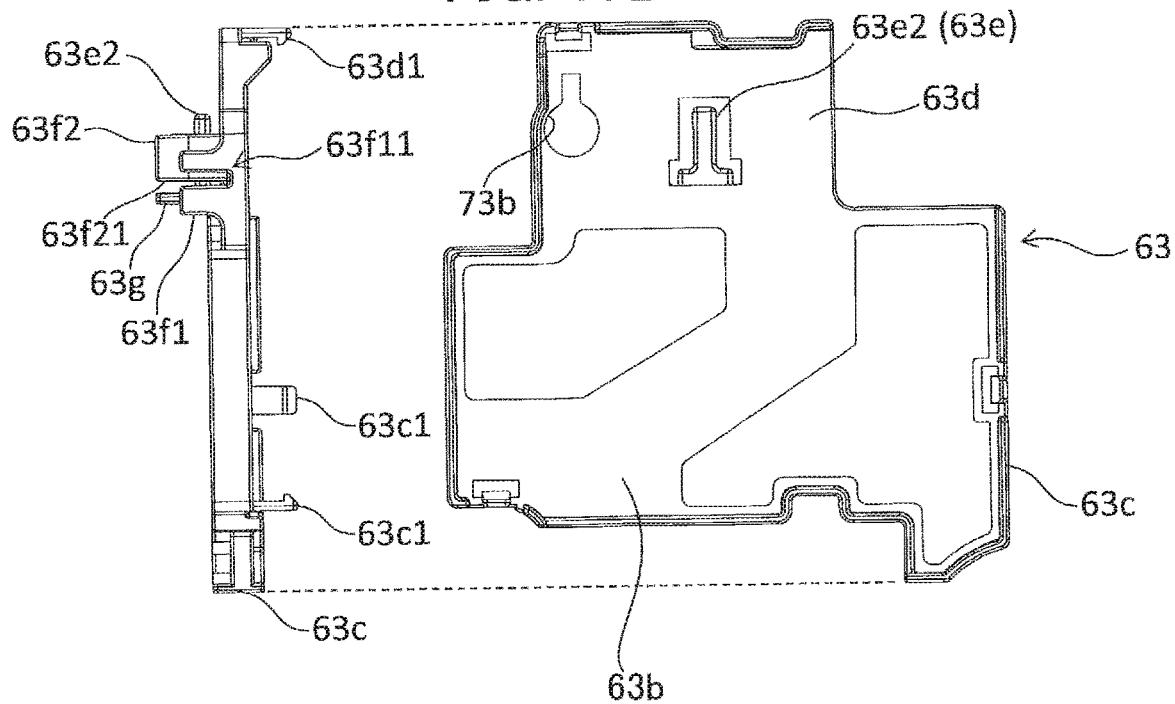
FIG. 17B contains a rear view and a bottom view of the holder.

The collar portion 63c includes two of the protrusions 63c1 positioned at the front end portion and right rear end portion of the collar portion 63c, respectively, to protruding downward therefrom. Each protrusion 63c1 has a lower end portion having a hook like shape as illustrated in FIGS. 17A and 17B. These hook-shaped lower ends of the protrusions 63c1 are engaged with the front portion and the right rear portion of the second substrate 62, respectively.

In the second region A2 of the holder 63, the holding plate portion 63d, a first holding portion 63e, a second holding portion 63f, and a harness supporting wall 63g are provided, as illustrated in FIG. 17A. As illustrated in FIGS. 16 and 17B, the holding plate portion 63d has a generally rectangular plate like shape, and is integral with the collar portion 63c. As illustrated in FIG. 17A, the holding plate portion 63d extends leftward generally horizontally from a generally front-rear center portion of the left end of the collar portion 63c. A protrusion 63d1 is provided at the left end of the holding plate portion 63d to protrude downward therefrom. The protrusion 63d1 has a lower end portion having a hook shape so as to be engageable with the left end of the second substrate 62 (also see FIGS. 19A and 19B).

The first holding portion 63e is a protruding portion for holding a ferrite core F having an annular shape (see FIG. 19A). As illustrated in FIG. 17A, the first holding portion 63e is positioned on a right end of the upper surface of the holding plate portion 63d at a position generally center thereof in the front-rear direction.

As illustrated in FIGS. 16 and 19A, the first holding portion 63e includes a base portion 63e1 and a horizontal portion 63e2.

The base portion 63e1 extends upward from the holding plate portion 63d to constitute a base end portion of the first holding portion 63e. The horizontal portion 63e2 protrudes horizontally leftward from an upper end portion of the base portion 63e1 to constitute a free end portion of the first holding portion 63e. That is, the first holding portion 63e has an inverted L-shape in a front view, as illustrated in FIG. 16.

The horizontal portion 63e2 has a T-shape in a plan view, as shown in FIGS. 16 and 17B. The horizontal portion 63e2 has a tip end portion positioned leftward of the base portion 63e1. The horizontal portion 63e2 of the first holding portion 63e is inserted in a through-hole F1 of the annular-shaped ferrite core F (see FIG. 19A).

The second holding portion 63f is a rib for holding the harness H (see FIG. 19B) extending from the ferrite core F. As illustrated in FIG. 17A, the second holding portion 63f includes a first rib 63f1 and a second rib 63f2.

The first rib 63f1 has a plate shape extending in the left-right direction and protruding upward on the rear end of the holding plate portion 63d at a right end thereof. The first rib 63f1 is formed with a holding groove 63f11 that extends downward from an upper end of the first rib 63f1. The holding groove 63f11 can hold the harness H therein.

The second rib 63f2 has a plate shape extending generally in parallel with the first rib 63f1. The second rib 63f2 is positioned between the first holding portion 63e and the first rib 63f1 in the front-rear direction. The second rib 63f2 protrudes upward from the holding plate portion 63d at a position frontward of the through-hole 73b, as illustrated in FIG. 16. The second rib 63f2 has a right end 63f21 which is positioned rightward of the through-hole 73b and leftward of the harness supporting wall 63g. The right end 63f21 of the second rib 63f2 is configured to abut on the harness H extending from the ferrite core F toward the holding groove 63f11 (see FIGS. 19B and 21).

As illustrated in FIG. 17A, the harness supporting wall 63g has a plate-like shape extending in the front-rear direction. The harness supporting wall 63g upstands at the right end of the holding plate portion 63d (on the left side of the collar portion 63c). The harness supporting wall 63g has an opening portion 63g1 positioned at a generally center in the front-rear direction in a lower portion of the harness supporting wall 63g. The opening portion 63g1 is positioned to span across the base portion 63e1 and the horizontal portion 63e2 of the first holding portion 63e. Here, at least one of the base portion 63e1 and the horizontal portion 63e2 may extend through the opening portion 63g1 of the harness supporting wall 63g. A harness retaining space 63g2 (see FIGS. 18B, 19B, and 21) is provided between the ferrite core F and the harness supporting wall 63g in a state where the ferrite core F is supported by the first holding portion 63e.

As described above, the first substrate 61, the second substrate 62, the ferrite core F, and the harness H are held by the holder 63, as illustrated in FIGS. 18A through 21. As illustrated in FIGS. 18A and 19A, the upper surface of the second substrate 62 is brought closer to the second surface 63b (the lower surface) of the holder 63 to face the same, and the protrusions 63c1 and the protrusion 63d1 are respectively engaged with the second substrate 62, so that the second substrate 62 is held by the holder 63. At this time, the second connector 62a (extending along the right end of the upper surface of the second substrate 62) is positioned outside (rightward) of the collar portion 63c.

The first connector 61a extending along the right end of the lower surface of the first substrate 61 is connectable to the second connector 62a to hold the same. The lower surface of the first substrate 61 is brought closer to the first surface 63a (the upper surface) of the holder 63 to face the same, such that the first connector 61a is connected to the second connector 62a while the lower surface of the first substrate 61 is in abutment with the upper end of the collar portion 63c. In this way, the first substrate 61 and the second substrate 62 are held to the holder 63, as illustrated in FIGS. 18B, 19B, 20 and 21. The first substrate 61 and the second substrate 62 are generally parallel to each other with the collar portion 63c of the holder 63 interposed between the first substrate 61 and the second substrate 62. The overlapping region of the holder 63 with the first substrate 61 is the first region A1.

In the second region A2 where the holder 63 does not overlap with the first substrate 61 in a plan view, the lower surface of the holding plate portion 63d faces the upper surface of the second substrate 62, and the upper surface of the holding plate portion 63d is exposed to the outside. The ferrite core F and the harness H are held by the horizontal portion 63e2 (the first holding portion 63e), the second holding portion 63f including the first rib 63f1 and the second rib 63f2, and the harness supporting wall 63g all of which are provided on the upper surface of the holding plate portion 63d. The harness H are wound by several turns over the annular-shaped ferrite core F so as to reduce noise generated in the harness H. As illustrated in FIGS. 19A and 19B, the horizontal portion 63e2 of the first holding portion 63e is inserted in the through-hole F1 at a radially center of the ferrite core F, so that the ferrite core F is held by the first holding portion 63e.

Figure 21:
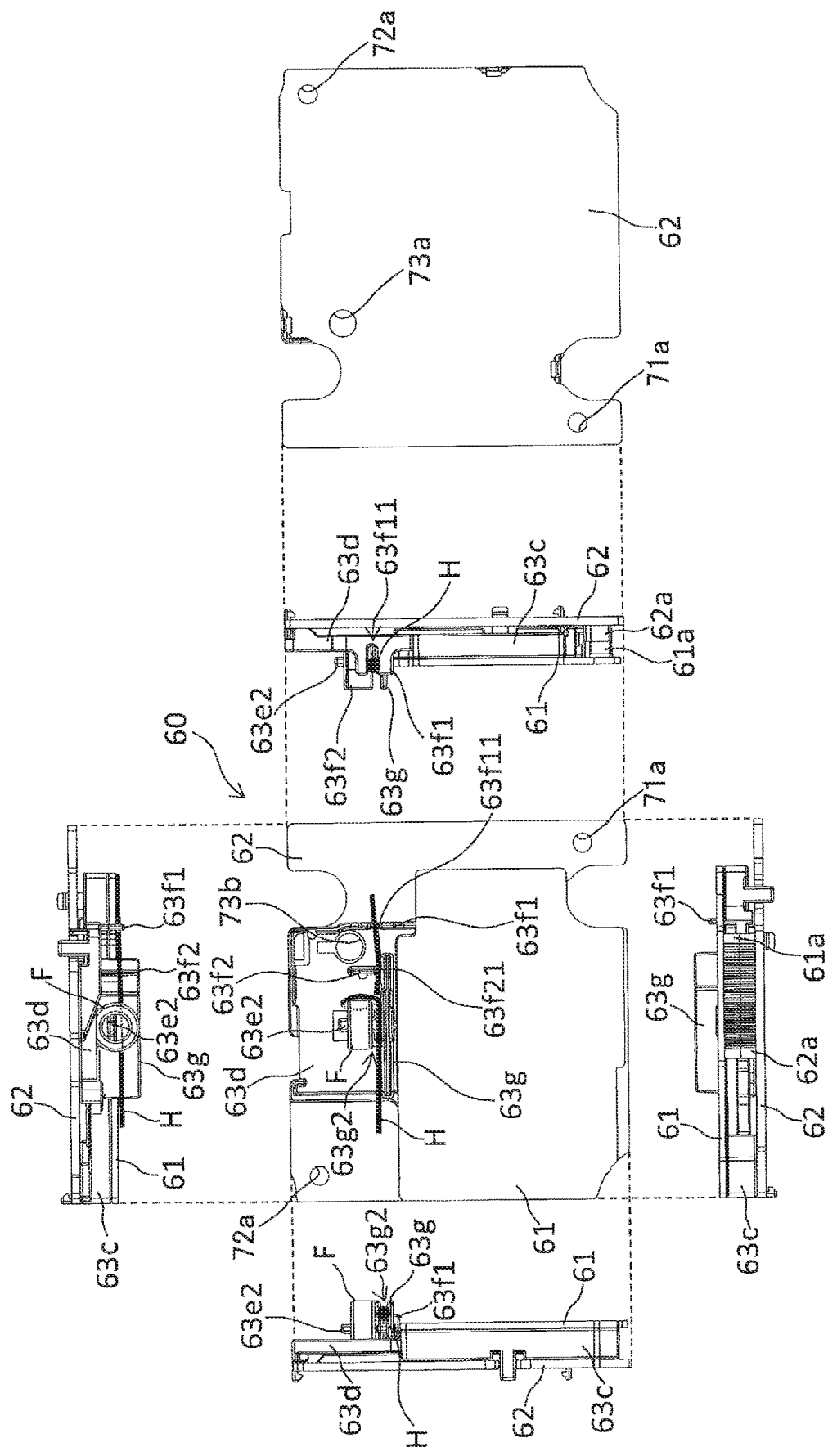
FIG. 21 contains a front view, a rear view, a right side view, a left side view, a plan view and a bottom view of the electronic circuit-board unit, and particularly illustrating a state where a ferrite core and a harness are held to a holding portion of the electronic circuit-board unit.

The harness H is configured to electrically connect the detector unit 23 and the sensor 42 to the second substrate 62. As illustrated in FIGS. 19B and 21, a portion of the harness H extending rearward from the ferrite core F held by the horizontal portion 63e2 is held by the holding groove 63f11 of the first rib 63f1. The portion of the harness H extending from the ferrite core F to the holding groove 63f11 is in abutment with the right end 63f21 of the second rib 63f2. With this configuration, the harness H is bent and extends from the ferrite core F to the first rib 63f1 without overlapping positioning with the through-hole 73b. Further, a portion of the harness H extending frontward from the ferrite core F can extend above and over the horizontal portion 63e2 and is retained in the harness retaining space 63g2 (see FIG. 19B) defined between the right end face of the ferrite core F and the left side surface of the harness supporting wall 63g.

<Advantageous Effects of the Embodiment>

As described above, the printing device 1 according to the embodiment includes the first frame 20 and the electronic circuit-board unit 60 provided at the first frame 20. The electronic circuit-board unit 60 includes the first substrate 61, the second substrate 62, and the holder 63 which are assembled all together into a unit. In the unitized structure, the first substrate 61 is attached to the holder 63 to face the first surface 63a of the holder 63, and the second substrate 62 is attached to the holder 63 to face the second surface 63b of the holder 63. The second substrate 62 is attached to the first frame 20, so that the electronic circuit-board unit 60 is fixed in position inside the printing device 1. According to the present embodiment, the two substrates (the first substrate 61 and second substrate 62) are unitized by the holder 63 to constitute the integral electronic circuit-board unit 60, and the electronic circuit-board unit 60 as a unit is mounted inside the printing device 1. With this structure, the electronic circuit-board unit 60 can be used as a general purpose or as a versatile circuit-board unit, regardless of the shape of the casing, cover and the like of the printing device 1.

Further, the holder 63 of the electronic circuit-board unit 60 is divided into the first region A1 (overlapping with the first substrate 61) and the second region A2 (not overlapping with the first substrate 61). The collar portion 63c provided in the first region A1 has the outer profile corresponding to the outer profile of the first substrate 61 to which the upper end of the holder 63 is attached, so that the first substrate 61 can be securely and stably attached to the collar portion 63c. In the second region A2, a holding portion for holding electronic components (the first holding portion 63e, the second holding portion 63f, and the harness supporting wall 63g) is provided. The ferrite core F (electric component) and the harness H are held by the holding portion. With this structure, no additional part or component is required for holding the ferrite core F associated with the electronic substrate and the harness H extending outward from the ferrite core F. As a result, this structure can reduce the number of parts and components and facilitate the assembling procedure, leading to a reduction in production costs.

Further, an exclusive cover design is required in a case where any structure is to be provided at the cover of the printing device 1 for supporting the ferrite core F and for routing the harness H. In contrast, according to the present embodiment, any exclusive structure is not necessary to be provided at the cover, since the ferrite core F and the harness H are held by the holding portion of the holder 63. Hence, the electronic circuit-board unit 60 according to the embodiment can provide an enhanced versatility.

Further, in the electronic circuit-board unit 60 according to the embodiment, the first substrate 61 and the second substrate 62 are electrically connected to each other through the first connector 61a (positioned at the right end of the first substrate 61) and the second connector 62a (positioned at the right end of the second substrate 62), and the collar portion 63c of the holder 63 is interposed between the first substrate 61 and the second substrate 62. That is, the first substrate 61 and the second substrate 62 are held to each other by the first connector 61a, the second connector 62a and the collar portion 63c. Here, for a comparison purpose, assume a case where the first substrate 61 and the second substrate 62 are held to each other only by the first connector 61a and the second connector 62a. Such a so-called cantilever supporting structure may render the relative posture of the first substrate 61 and the second substrate 62 unstable. In contrast, in the electronic circuit-board unit 60 according to the embodiment, the relative posture of the first substrate 61 and the second substrate 62 can be kept stable due to the interposition of the collar portion 63c between the first substrate 61 and the second substrate 62.

As such, according to the present embodiment, the number of parts and components can be reduced, and the assembling procedure can be facilitated in terms of the production of a printing device including electronic substrates.

Further, according to the present embodiment, the holding portion includes the first holding portion 63e for holding a predetermined electronic component (ferrite core F), and the second holding portion 63f for holding the harness H. Due to the co-presence of the first holding portion 63e and the second holding portion 63f as the holding portion, both of the predetermined electronic component (ferrite core F) and the harness H can be securely held by the holding portion.

In particular, according to the present embodiment, the electronic component held by the first holding portion 63e is the annular ferrite core F. The first holding portion 63e (as a protruding portion) is horizontally inserted in the through-hole F1 formed in the radially center portion of the ferrite core F. With this structure, the ferrite core F can be securely held by the holder 63. Further, upon application of any external vibration or impacting force to the electronic circuit-board unit 60, the harness H wound over the ferrite core F can be resiliently deformed suitable to moderate or absorb the vibration and impacting force. Further, the ferrite core F and the first and second substrates 61, 62 are to move integrally in response to the application of the external vibration and impacting force. Therefore, mutual collision and mechanical interference between the ferrite core F and the first and second substrates 61, 62 can be suppressed, thereby restricting any damage to the ferrite core F and the first and second substrates 61, 62, and deterioration in durability of these components.

Further, according to the present embodiment, the second holding portion 63f includes the first rib 63f1 and the second rib 63f2. The first rib 63f1 has the holding groove 63f11 to retain the harness H extending from the ferrite core F held by the first holding portion 63e. Further, the second rib 63f2 is positioned between the ferrite core F and the first rib 63f1. The portion of the harness H extending from the ferrite core F toward the first rib 63f1 can be abutted and held on the right end 63f21 of the second rib 63f2. Since the first rib 63f1 and the second rib 63f2 function to hold the harness H extending from the ferrite core F, this structure can reduce application of load to the harness H, particularly, to the portion of the harness H near the ferrite core F, even if an external vibration and/or impacting force may be applied to the harness H. Accordingly, soundness of the harness H can be maintained. Further, the arrangement of the embodiment (the holding function of the first rib 63f1 and the second rib 63f2) can also restrain displacement of the ferrite core F in a direction urging disengagement of the ferrite core F from the first holding portion 63e upon application of an external vibration and impacting force. That is, the arrangement of the first rib 63f1 and the second rib 63f2 can suppress disengagement of the ferrite core F from the first holding portion 63e.

Further, according to the present embodiment, the first holding portion 63e has the inverted L-shape provided by the base portion 63e1 and the horizontal portion 63e2. The horizontal portion 63e2 horizontally extends from the upper portion of the base portion 63e1 and is inserted in the through-hole F1 of the ferrite core F to attain the function of holding the ferrite core F. With this structure, although the harness H runs above the horizontal portion 63e2 rather than underneath the horizontal portion 63e2, the harness H can be retained stably in the harness retaining space 63g2 defined between the harness supporting wall 63g and the ferrite core F. Compared to a configuration where the harness H is arranged to run below the horizontal portion 63e2, arranging the harness H to run over the horizontal portion 63c2 as in the embodiment can provide, for the harness H, an elongated vertical creeping distance from the holding plate portion 63. As a result, this arrangement of the embodiment can reduce generation of noise that may occur in the harness H.

Throughout the description, strict literal interpretation of the expressions "identical", "same", "equal", and "different" as to shape, size, and dimension should be obviated, but these expressions encompass "substantially identical, "substantially the same", "substantially equal", and "substantially different" within a meaning of production tolerance, etc.

While the description has been made in detail with reference to the embodiments, it would be apparent to those skilled in the art that many modifications and variations may be made thereto.

[Remarks]

The printing device 1 is an example of a printing device. The first frame 20 is an example of a frame. The electronic circuit-board unit 60 is an example of an electronic circuit-board unit. The holder 63 is an example of a holder. The first surface 63a and second surface 63b are examples of a first surface and a second surface of the holder, respectively. The first substrate 61 is an example of a first substrate. The second substrate 62 is an example of a second substrate. The first region A1 is an example of a first region of the holder. The second region A2 is an example of a second region of the holder. The ferrite core F is an example of an electronic component. The harness H is an example of a harness. The first holding portion 63e is an example of a first holding portion. The second holding portion 63f is an example of a second holding portion. The first rib 63f1 is an example of a first rib of the second holding portion. The second rib 63f2 is an example of a second rib of the second holding portion. The collar portion 63c is an example of a collar portion. The holding plate portion 63d is an example of a holding plate portion. The base portion 63e1 is an example of a base portion of the first holding portion. The horizontal portion 63e2 is an example of a horizontal portion of the first holding portion. The harness supporting wall 63g is an example of a harness supporting wall. The tape is an example of a printing medium. The protrusions 63c1 are an example of a "first protrusion". The protrusion 63d1 is an example of a second protrusion. The casing 10 is an example of a casing. The second frame 30 is an example of a second frame. The upper front cover 12 is an example of a first cover. The upper rear cover 13 is an example of a second cover. The lower case 11 is an example of a lowercase. The recessed portion 11a is an example of a recessed portion of the lower case.

What is claimed is:

1. A printing device comprising
a frame; and
an electronic circuit-board unit attached to the frame, the electronic circuit-board unit comprising:
 a holder having a first surface facing the frame and a second surface opposite to the first surface, the holder having a first region and a second region, the holder comprising a holding portion;
 a first substrate facing and held to the first surface, the first substrate being overlapped with the first region in a plan view, and the first substrate being offset from the second region in the plan view;
 a second substrate facing and held to the second surface, the second substrate being attached to the frame;
 an electronic component; and
 a harness electrically connected to the electronic component, at least one of the electronic component and the harness being held by the holding portion.

2. The printing device according to claim 1,
wherein the holding portion comprises:
 a first holding portion holding the electronic component; and
 a second holding portion holding the harness.

3. The printing device according to claim 2,
wherein the electronic component is an annular ferrite core over which the harness is wound, the ferrite core defining a through-hole at a radially center portion of the annular ferrite core, and
wherein the first holding portion is a protruding portion horizontally extending through the through-hole to hold the ferrite core.

4. The printing device according to claim 3,
wherein the second holding portion comprises:
 a first rib formed with a holding groove configured to hold the harness extending from the ferrite core held by the first holding portion; and
 a second rib positioned between the first rib and the ferrite core held by the first holding portion, the second rib being in contact with the harness extending from the ferrite core toward the first rib.

5. The printing device according to claim 3,
wherein the holder further comprises:
 a collar portion provided on the first surface and having an outer profile corresponding to an outer profile of the first substrate in the plan view; and
 a holding plate portion integral with the collar portion and defining the second region, wherein the first holding portion comprises:
  a base portion upstanding from the holding plate portion; and
  a horizontal portion horizontally extending from an upper end of the base portion, the horizontal portion being inserted in the through-hole of the ferrite core, and
wherein the holder further comprises a harness supporting wall upstanding from the holding plate portion, the harness supporting wall having a lower portion formed with an opening portion to allow the base portion or the horizontal portion to extend through the opening portion, the harness supporting wall and the ferrite core held by the first holding portion defining therebetween a harness retaining space in which the harness is held.

6. The printing device according to claim 5, further comprising:
  a first protrusion protruding from the collar portion, the first protrusion having a hooked portion engaged with the second substrate; and
  a second protrusion protruding from the holding plate portion, the second protrusion having a hooked portion engaged with the second substrate.

7. The printing device according to claim 3, further comprising:
  a first connector provided on the first substrate; and
  a second connector provided on the second substrate and electrically connectable to the first connector.

8. The printing device according to claim 1,
wherein the holder further comprises:
  a collar portion provided on the first surface and defining the first region, the collar portion having an upper end and a lower end; and
  a holding plate portion integral with the collar portion and defining the second region, and
wherein the first substrate is in contact with the upper end of the collar portion, and the second substrate is in contact with the lower end of the collar portion.

9. The printing device according to claim 1, further comprising a casing in which the frame is accommodated.

10. The printing device according to claim 9,
wherein the second substrate is screw-fixed to the frame to fix the electronic circuit-board unit to the frame inside the casing.

11. The printing device according to claim 9, further comprising a second frame connected to the frame and configured to accommodate a printing medium therein,
wherein the casing comprises:
  a first cover covering the frame; and
  a second cover covering the second frame; and
  a lower case having a recessed portion configured to accommodate a battery therein, the second cover being pivotably movably connected to the lower case.

12. The printing device according to claim 11,
wherein the electronic circuit-board unit is positioned between the frame and the recessed portion.

* * * * *